United States Patent
Oie et al.

(10) Patent No.: US 10,377,978 B2
(45) Date of Patent: Aug. 13, 2019

(54) ALKALINE EARTH METAL-CONTAINING CLEANING SOLUTION FOR CLEANING SEMICONDUCTOR ELEMENT, AND METHOD FOR CLEANING SEMICONDUCTOR ELEMENT USING SAME

(71) Applicant: MITSUBISHI GAS CHEMICAL COMPANY, INC., Chiyoda-ku (JP)

(72) Inventors: Toshiyuki Oie, Tokyo (JP); Kenji Shimada, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 0 days.

(21) Appl. No.: 15/522,221

(22) PCT Filed: Oct. 2, 2015

(86) PCT No.: PCT/JP2015/078078
§ 371 (c)(1),
(2) Date: Apr. 26, 2017

(87) PCT Pub. No.: WO2016/076034
PCT Pub. Date: May 19, 2016

(65) Prior Publication Data
US 2017/0335248 A1    Nov. 23, 2017

(30) Foreign Application Priority Data
Nov. 13, 2014  (JP) .................................. 2014-230637

(51) Int. Cl.
*C11D 7/18*   (2006.01)
*C11D 7/10*   (2006.01)
(Continued)

(52) U.S. Cl.
CPC ................. *C11D 7/105* (2013.01); *C11D 7/02* (2013.01); *C11D 7/26* (2013.01); *C11D 17/08* (2013.01);
(Continued)

(58) Field of Classification Search
CPC .................................................. C11D 11/0047
(Continued)

(56) References Cited

U.S. PATENT DOCUMENTS 5,049,200 A   9/1991  Brunner et al.
5,795,702 A   8/1998  Tanabe et al.
(Continued)

FOREIGN PATENT DOCUMENTS

EP    1 975 987 A2   10/2008
EP    3 193 359 A1    7/2017
(Continued)

OTHER PUBLICATIONS

15116372 Foreign Priority Document Aug. 3, 2016 (Year: 2016).*
(Continued)

*Primary Examiner* — Gregory E Webb
(74) *Attorney, Agent, or Firm* — Oblon, McClelland, Maier & Neustadt, L.L.P.

(57) ABSTRACT

According to the present invention, it is possible to provide a cleaning solution which removes a dry etching residue and photoresist on a surface of a semiconductor element having a low dielectric constant film (a low-k film) and at least one material selected from between a material that contains 10 atom % or more of titanium and a material that contains 10 atom % or more of tungsten, wherein the cleaning solution contains: 0.002-50 mass % of at least one type of oxidizing agent selected from among a peroxide, perchloric acid, and a perchlorate salt; 0.000001-5 mass % of an alkaline earth metal compound; and water.

11 Claims, 4 Drawing Sheets

(51) Int. Cl.

| | | |
|---|---|---|
| *C11D 7/02* | (2006.01) | |
| *C11D 17/08* | (2006.01) | |
| *C11D 7/26* | (2006.01) | |
| *H01L 21/02* | (2006.01) | |
| *H01L 21/311* | (2006.01) | |
| *G03F 7/42* | (2006.01) | |
| *H01L 21/768* | (2006.01) | |

(52) U.S. Cl.
CPC ........ *G03F 7/423* (2013.01); *H01L 21/02063* (2013.01); *H01L 21/31133* (2013.01); *H01L 21/31116* (2013.01); *H01L 21/31144* (2013.01); *H01L 21/76814* (2013.01)

(58) Field of Classification Search
USPC .................................................. 510/175, 176
See application file for complete search history.

(56) References Cited

U.S. PATENT DOCUMENTS

| | | | |
|---|---|---|---|
| 2003/0148624 | A1 | 8/2003 | Ikemoto et al. |
| 2007/0235684 | A1 | 10/2007 | Mistkawi et al. |
| 2009/0082240 | A1 | 3/2009 | Nukui et al. |
| 2010/0112728 | A1* | 5/2010 | Korzenski ......... H01L 21/02079 438/3 |
| 2011/0129998 | A1 | 6/2011 | Eto et al. |
| 2011/0281436 | A1 | 11/2011 | Inaba et al. |
| 2013/0296214 | A1 | 11/2013 | Barnes et al. |
| 2015/0152366 | A1 | 6/2015 | Shimada et al. |
| 2016/0351388 | A1* | 12/2016 | Liu ................... H01L 21/02074 |
| 2017/0233687 | A1 | 8/2017 | Oie et al. |
| 2017/0240850 | A1 | 8/2017 | Oie et al. |

FOREIGN PATENT DOCUMENTS

| | | |
|---|---|---|
| EP | 3 220 409 A1 | 9/2017 |
| JP | 8-334905 A | 12/1996 |
| JP | 9-96911 A | 4/1997 |
| JP | 9-152721 A | 6/1997 |
| JP | 2001-26890 A | 1/2001 |
| JP | 2003-223010 A | 8/2003 |
| JP | 2003-257922 A | 9/2003 |
| JP | 2003-316028 A | 11/2003 |
| JP | 2003-330205 A | 11/2003 |
| JP | 2007-510307 A | 4/2007 |
| JP | 2007-298930 A | 11/2007 |
| JP | 2008-285508 A | 11/2008 |
| JP | 2009-21516 A | 1/2009 |
| JP | 2009-69505 A | 4/2009 |
| JP | 2009-75285 A | 4/2009 |
| JP | 2009-527131 A | 7/2009 |
| JP | 2009-209431 A | 9/2009 |
| JP | 2009-231354 A | 10/2009 |
| JP | 2011-118101 A | 6/2011 |
| JP | 2011-228365 A | 11/2011 |
| JP | 2011-243610 A | 12/2011 |
| JP | 2012-9513 A | 1/2012 |
| JP | 2012-46685 A | 3/2012 |
| JP | 2012-60050 A | 3/2012 |
| JP | 2012-94703 | 5/2012 |
| JP | 2013-533631 A | 8/2013 |
| JP | WO2013/187313 A1 | 12/2013 |
| WO | 2005/043245 A2 | 5/2005 |

OTHER PUBLICATIONS

International Search Report dated Nov. 17, 2015 in PCT/JP2015/078078 filed Oct. 2, 2015.
Extended European Search Report dated May 3, 2018 in European Patent Application No. 15858769.1, 11 pages.
Nuding, D.L., et al., "Deliquescence and Efforescence of Calcium Perchlorate: An investigation of stable aqueous solutions relevant to Mars", Icanus, XP029088894, vol. 243, Aug. 27, 2014, pp. 420-428.
Jalili, M., et al., "Reduction of Mycotoxins in White Pepper", Food Additives & Contaminants: Part A, XP 55469399, vol. 29 No. 12, Dec. 2012, pp. 1947-1956 with cover page.

* cited by examiner

[Figure 1]
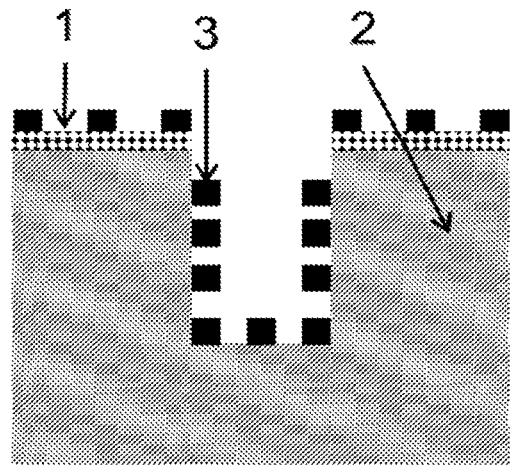
[Figure 2]
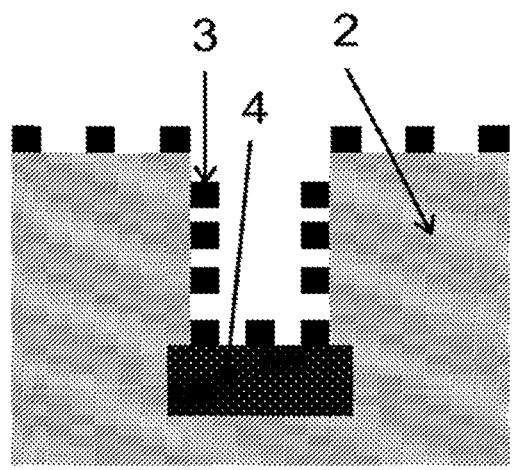

[Figure 3]
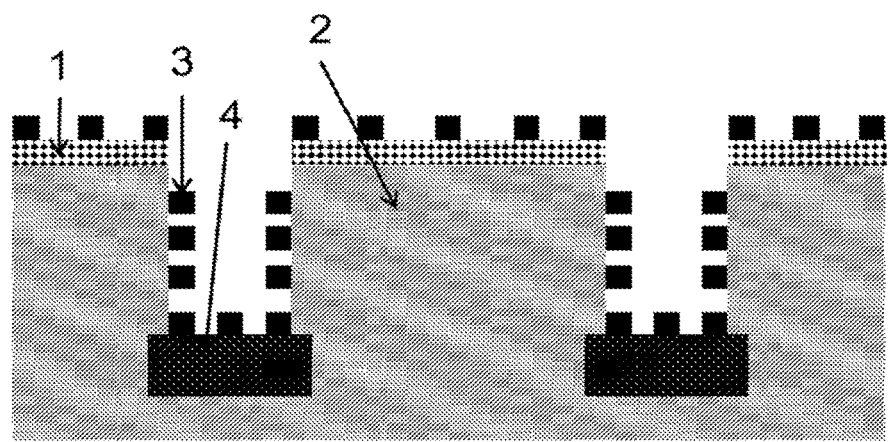
[Figure 4]
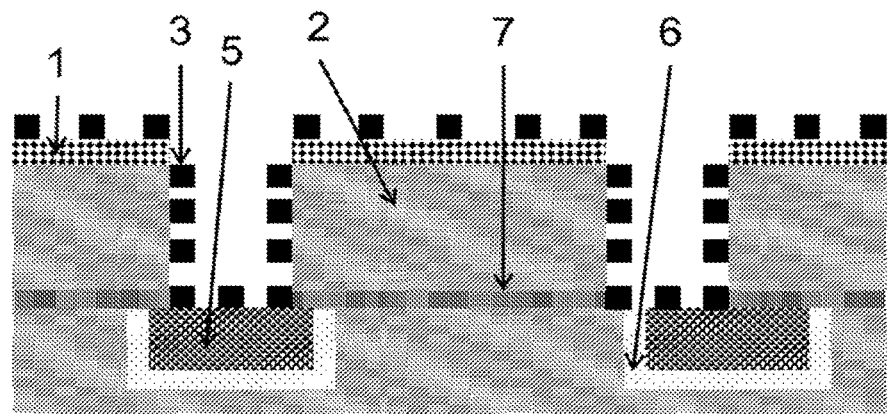

[Figure 5]
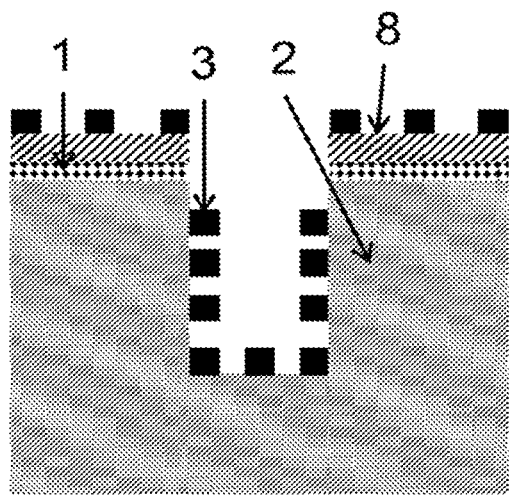
[Figure 6]
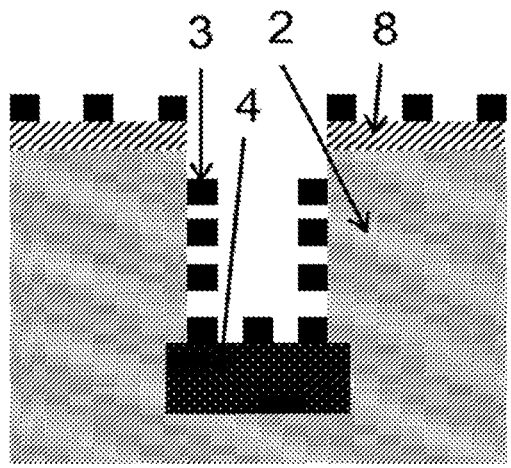

[Figure 7]
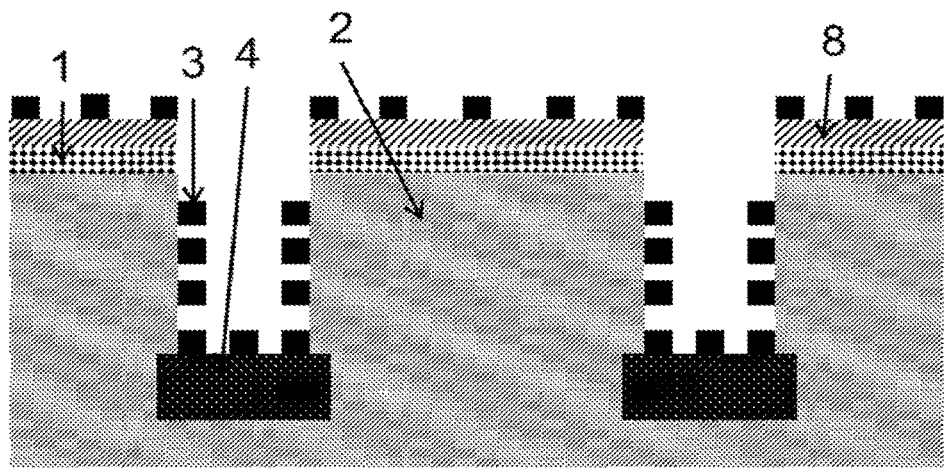
[Figure 8]
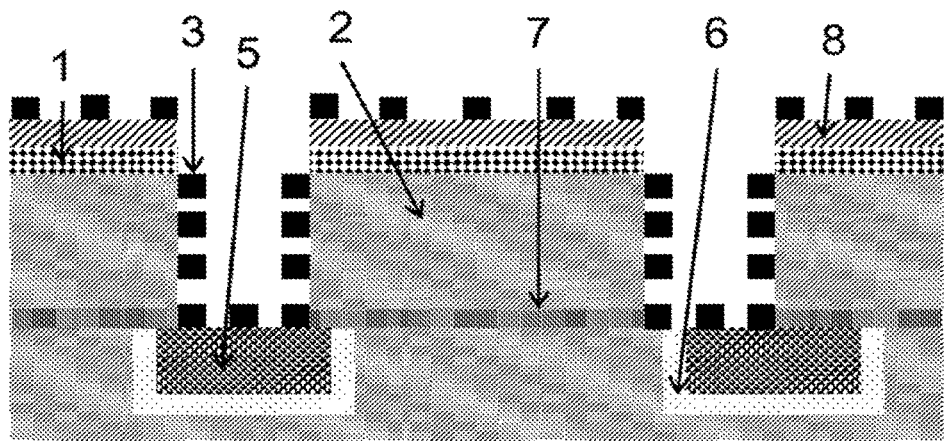

ALKALINE EARTH METAL-CONTAINING CLEANING SOLUTION FOR CLEANING SEMICONDUCTOR ELEMENT, AND METHOD FOR CLEANING SEMICONDUCTOR ELEMENT USING SAME

CROSS-REFERENCE TO RELATED APPLICATIONS

This application is a National Stage of PCT/JP2015/078078, which was filed on Oct. 2, 2015. This application is based upon and claims the benefit of priority to Japanese Application No. 2014-230637, which was filed on Nov. 13, 2014.

TECHNICAL FIELD

The present invention relates to a cleaning solution, which suppresses damage to at least a low-dielectric constant interlayer dielectric film and at least one material selected from a titanium-containing material and a tungsten-containing material and removes a dry etching residue and a photoresist on a surface of a product to be treated in the process for manufacturing a semiconductor element, and a cleaning method using the same.

BACKGROUND ART

The production of a highly integrated semiconductor element generally has a series of processes as follows: a conductive thin film such as a metal film as a conductive wiring material and an interlayer dielectric film for insulation between conductive thin films are formed on an element such as a silicon wafer; after that, a photoresist is uniformly applied to the surface thereof to provide a photosensitive layer, and this is subjected to the selective exposure/development treatment to form a desired photoresist pattern; then the dry etching treatment is applied to the interlayer dielectric film using the photoresist pattern as a mask to form a desired pattern on the thin film; and then the photoresist pattern, residue generated by the dry etching treatment (hereinafter referred to as "dry etching residue"), etc. are completely removed by ashing with oxygen plasma, cleaning with a cleaning solution or the like.

Recently, the miniaturization of design rules has been accelerated, and the limit of high-speed arithmetic processing has been gradually controlled by signal transmission delay. For this reason, the conductive wiring material has been changed from aluminium to copper which has lower electrical resistance, and the interlayer dielectric film has been changed from a silicone oxide film to a low dielectric constant film (a film having a dielectric constant of less than 3, hereinafter referred to as "low-k film"). Patterns of 0.2 μm or less have problems in which, for example, the aspect ratio of a pattern of a photoresist having a film thickness of 1 μm (the ratio obtained by dividing the film thickness of the photoresist by the line width of the photoresist) is too large, resulting in collapse of the pattern. In order to solve this, sometimes used is the hard mask method in which: a titanium-based or silicon-based film (hereinafter referred to as "the hard mask") is inserted between a pattern film on which a pattern is desired to be actually formed and a photoresist film; a photoresist pattern is transferred to the hard mask by dry etching; and after that, this hard mask is used as an etching mask to transfer the pattern to the film on which the pattern is desired to be actually formed by dry etching. In this method, a gas to be used for etching the film on which the pattern is desired to be actually formed may be changed from a gas to be used for etching the hard mask. It is possible to select a gas which can secure a selection ratio with the photoresist when etching the hard mask and to select a gas which can secure a selection ratio with the hard mask when etching the actual film. For this reason, there is an advantage that a pattern can be formed with a thin photoresist. Further, a tungsten-containing material is used for a contact plug for connection to a substrate.

With the miniaturization of design rules, thinning of the gate insulating film of the transistor has been approaching the limit, and a high dielectric constant film has been gradually used for the gate insulating film. Since it is difficult to control the threshold voltage by a polycrystalline silicon which is conventionally used for the high dielectric constant film as the gate material, a material containing titanium or tungsten is sometimes used as the high dielectric constant film. Further, in aluminium wirings, a tungsten-containing material is used for a contact plug which connects wirings of different layers.

Since a hard mask, a low-k film, a tungsten-containing material and copper or a copper alloy are exposed in the process of removing a dry etching residue and a photoresist in this way, when a dry etching residue and a photoresist are removed with oxygen plasma, the hard mask, the low-k film, the tungsten-containing material and the copper or copper alloy are damaged due to exposure to oxygen plasma or the like, resulting in significant deterioration of electrical characteristics and problems in production processes after that. For this reason, it is desired to suppress damage to these materials while removing the dry etching residue and the photoresist at a level comparable to that of an oxygen plasma process.

Regarding the treatment with a cleaning solution, it is known that a dry etching residue and a photoresist can be removed by using a strong alkali-based cleaning solution or an oxidant-containing cleaning solution. The strong alkali-based cleaning solution may remove a residue, but its removability of the dry etching residue and the photoresist is inferior to that of the oxidant-containing cleaning solution. Meanwhile, the oxidant-containing cleaning solution has excellent removability of the dry etching residue and the photoresist, but when it is brought into contact with a material containing titanium or tungsten, the material containing titanium or tungsten is significantly damaged. For this reason, it is desired to develop a cleaning solution containing an oxidant capable of effectively removing a dry etching residue and a photoresist without damage to a titanium-containing material or tungsten-containing material. In addition, it is desired to develop a cleaning solution containing an oxidant which does not damage copper or a copper alloy as well as a material containing titanium or tungsten.

Patent Document 1 proposes a wiring forming method using a cleaning solution containing an oxidant, quaternary ammonium hydroxide, alkanolamine, alkali metal hydroxide and water. When using this cleaning solution, it is possible to remove a residue while suppressing damage to a low-k film, but damage to a titanium-containing material cannot be suppressed. Accordingly, this cleaning solution cannot be used for cleaning a semiconductor element, wherein damage to a titanium-containing material and a low-k film is suppressed and a dry etching residue is removed, which is the purpose of the present invention (see Comparative Examples 19 and 20).

Patent Document 2 proposes a wiring forming method using a cleaning solution containing an oxidant, a metal etching agent and a surfactant and having a pH value of 10 to 14. When using this cleaning solution, it is possible to remove a residue while suppressing damage to a low-k film, but damage to a titanium-containing material cannot be suppressed. Accordingly, this cleaning solution cannot be used for cleaning a semiconductor element, wherein damage to a titanium-containing material and a low-k film is suppressed and a dry etching residue is removed, which is the purpose of the present invention (see Comparative Examples 21 and 22).

Patent Document 3 proposes a wiring forming method using a cleaning solution containing a cleaning agent, a basic organic compound, an acidic organic compound, an imidazole and water. When using this cleaning solution, it is possible to suppress damage to a titanium-containing material, but a residue cannot be removed, and damage to a low-k film cannot be suppressed. Accordingly, this cleaning solution cannot be used for cleaning a semiconductor element, wherein damage to a titanium-containing material and a low-k film is suppressed and a dry etching residue is removed, which is the purpose of the present invention (see Comparative Example 23).

Patent Document 4 proposes a wiring forming method using a cleaning solution containing a cleaning agent, a basic organic compound, an acidic organic compound, a nitrogen-containing non-aromatic cyclic compound and water. When using this cleaning solution, it is possible to suppress damage to a titanium-containing material, but a residue cannot be removed, and damage to a low-k film cannot be suppressed. Accordingly, this cleaning solution cannot be used for cleaning a semiconductor element, wherein damage to a titanium-containing material and a low-k film is suppressed and a dry etching residue is removed, which is the purpose of the present invention (see Comparative Example 24).

Patent Document 5 proposes a wiring forming method using a cleaning solution containing a hydroxylamine-based compound, amine, a water-soluble organic solvent, a metal anticorrosive and water. When using this cleaning solution, it is possible to suppress damage to a titanium-containing material, but a residue cannot be removed, and damage to a low-k film cannot be suppressed. Accordingly, this cleaning solution cannot be used for cleaning a semiconductor element, wherein damage to a titanium-containing material and a low-k film is suppressed and a dry etching residue is removed, which is the purpose of the present invention (see Comparative Example 25).

Patent Document 6 proposes a wiring forming method using a cleaning solution containing phosphoric acid, hydrochloric acid, amine, an alanine type surfactant and water. When using this cleaning solution, it is possible to suppress damage to a tungsten-containing material, but a residue cannot be removed, and damage to a low-k film cannot be suppressed. Accordingly, this cleaning solution cannot be used for cleaning a semiconductor element, wherein damage to a tungsten-containing material and a low-k film is suppressed and a dry etching residue is removed, which is the purpose of the present invention (see Comparative Example 26).

Patent Document 7 proposes a wiring forming method using a cleaning solution containing hydrogen peroxide, a triazole and water. When using this cleaning solution, it is possible to suppress damage to a low-k film while removing a residue, but damage to a tungsten-containing material cannot be suppressed. Accordingly, this cleaning solution cannot be used for cleaning a semiconductor element, wherein damage to a tungsten-containing material and a low-k film is suppressed and a dry etching residue is removed, which is the purpose of the present invention (see Comparative Examples 27 and 28).

Patent Document 8 proposes a wiring forming method using a cleaning solution containing hydrogen peroxide, quaternary ammonium hydroxide, quaternary ammonium salt and water. When using this cleaning solution, it is possible to suppress damage to a low-k film while removing a residue, but damage to a tungsten-containing material cannot be suppressed. Accordingly, this cleaning solution cannot be used for cleaning a semiconductor element, wherein damage to a tungsten-containing material and a low-k film is suppressed and a dry etching residue is removed, which is the purpose of the present invention (see Comparative Examples 29 and 30).

Patent Document 9 proposes a wiring forming method using a cleaning solution containing an inorganic base, quaternary ammonium hydroxide, an organic solvent, azole and water. When using this cleaning solution, it is possible to suppress damage to a tungsten-containing material, but a residue cannot be removed, and damage to a low-k film cannot be suppressed. Accordingly, this cleaning solution cannot be used for cleaning a semiconductor element, wherein damage to a tungsten-containing material and a low-k film is suppressed and a dry etching residue is removed, which is the purpose of the present invention (see Comparative Example 31).

Patent Document 10 proposes a wiring forming method using a cleaning solution containing hydrogen peroxide, hydrofluoric acid, an organic solvent, azole and water. When using this cleaning solution, it is possible to remove a residue, but damage to a tungsten-containing material and a low-k film cannot be suppressed. Accordingly, this cleaning solution cannot be used for cleaning a semiconductor element, wherein damage to a tungsten-containing material and a low-k film is suppressed and a dry etching residue is removed, which is the purpose of the present invention (see Comparative Examples 32 and 33).

Patent Document 11 proposes a wiring forming method using a cleaning solution containing hydrofluoric acid, an organic solvent, azole and water. When using this cleaning solution, it is possible to suppress damage to a tungsten-containing material, but a residue cannot be removed, and damage to a low-k film cannot be suppressed. Accordingly, this cleaning solution cannot be used for cleaning a semiconductor element, wherein damage to a tungsten-containing material and a low-k film is suppressed and a dry etching residue is removed, which is the purpose of the present invention (see Comparative Example 34).

Patent Document 12 proposes a wiring forming method using a cleaning solution containing hydrofluoric acid, a silicon-containing compound, a surfactant, carboxylic acid, an anticorrosive and water. When using this cleaning solution, it is possible to suppress damage to a tungsten-containing material, but a residue cannot be removed, and damage to a low-k film cannot be suppressed. Accordingly, this cleaning solution cannot be used for cleaning a semiconductor element, wherein damage to a tungsten-containing material and a low-k film is suppressed and a dry etching residue is removed, which is the purpose of the present invention (see Comparative Example 35).

Patent Document 13 proposes a wiring forming method using a cleaning solution containing a sugar, a hydroxylamine, a quaternary ammonium compound, an organic acid and water. When using this cleaning solution, it is possible to suppress damage to a low-k film, but a residue cannot be removed, and damage to a tungsten-containing material cannot be suppressed. Accordingly, this cleaning solution cannot be used for cleaning a semiconductor element, wherein damage to a tungsten-containing material and a low-k film is suppressed and a dry etching residue is removed, which is the purpose of the present invention (see Comparative Example 36).

Patent Documents 14 and 15 propose a wiring forming method using a cleaning solution containing an acid or salt thereof, a chelating agent containing nitrogen atoms, an organic solvent and water. When using this cleaning solution, it is possible to suppress damage to a tungsten-containing material, but a residue cannot be removed, and damage to a low-k film cannot be suppressed. Accordingly, this cleaning solution cannot be used for cleaning a semiconductor element, wherein damage to a tungsten-containing material and a low-k film is suppressed and a dry etching residue is removed, which is the purpose of the present invention (see Comparative Example 37).

Patent Document 16 proposes a wiring forming method using a cleaning solution containing N,N-diethylhydroxylamine, hydroxylamine, a water-soluble organic solvent, a metal anticorrosive and water. When using this cleaning solution, it is possible to suppress damage to a tungsten-containing material, but a residue cannot be removed, and damage to copper or a copper alloy, a low-k film and a titanium-containing material cannot be suppressed. Accordingly, this cleaning solution cannot be used for cleaning a semiconductor element, wherein: damage to a titanium-containing material and a low-k film is suppressed and a dry etching residue is removed; damage to a tungsten-containing material and a low-k film is suppressed and a dry etching residue is removed; or damage to a titanium-containing material, a tungsten-containing material, copper or a copper alloy and a low-k film is suppressed and a dry etching residue is removed, which is the purpose of the present invention (see Comparative Example 39).

Patent Document 17 proposes a wiring forming method using a cleaning solution containing alkanolamine, N,N-diethylhydroxylamine, diethylene glycol monoalkyl ether, a sugar and water. When using this cleaning solution, it is possible to suppress damage to a tungsten-containing material, copper or a copper alloy and a titanium-containing material, but a residue cannot be removed, and damage to a low-k film cannot be suppressed. Accordingly, this cleaning solution cannot be used for cleaning a semiconductor element, wherein: damage to a titanium-containing material and a low-k film is suppressed and a dry etching residue is removed; damage to a tungsten-containing material and a low-k film is suppressed and a dry etching residue is removed; or damage to a titanium-containing material, a tungsten-containing material, copper or a copper alloy and a low-k film is suppressed and a dry etching residue is removed, which is the purpose of the present invention (see Comparative Example 40).

Patent Document 18 proposes a wiring forming method using a cleaning solution containing potassium hydroxide, quaternary ammonium hydroxide, an organic solvent, pyrazole and water. When using this cleaning solution, it is possible to suppress damage to a tungsten-containing material, copper or a copper alloy and a titanium-containing material, but a residue cannot be removed, and damage to a low-k film cannot be suppressed. Accordingly, this cleaning solution cannot be used for cleaning a semiconductor element, wherein: damage to a titanium-containing material and a low-k film is suppressed and a dry etching residue is removed; damage to a tungsten-containing material and a low-k film is suppressed and a dry etching residue is removed; or damage to a titanium-containing material, a tungsten-containing material, copper or a copper alloy and a low-k film is suppressed and a dry etching residue is removed, which is the purpose of the present invention (see Comparative Example 41).

Patent Document 19 proposes a wiring forming method using a cleaning solution containing a fluorine compound, a metal corrosion inhibitor, a passivator and water. When using this cleaning solution, it is possible to suppress damage to a tungsten-containing material, copper or a copper alloy and a titanium-containing material, but a residue cannot be removed, and damage to a low-k film cannot be suppressed. Accordingly, this cleaning solution cannot be used for cleaning a semiconductor element, wherein: damage to a titanium-containing material and a low-k film is suppressed and a dry etching residue is removed; damage to a tungsten-containing material and a low-k film is suppressed and a dry etching residue is removed; or damage to a titanium-containing material, a tungsten-containing material, copper or a copper alloy and a low-k film is suppressed and a dry etching residue is removed, which is the purpose of the present invention (see Comparative Example 42).

Patent Document 20 proposes a wiring forming method using a cleaning solution containing ammonium fluoride, gluconic acid and water. When using this cleaning solution, it is possible to suppress damage to a tungsten-containing material, copper or a copper alloy and a titanium-containing material, but a residue cannot be removed, and damage to a low-k film cannot be suppressed. Accordingly, this cleaning solution cannot be used for cleaning a semiconductor element, wherein: damage to a titanium-containing material and a low-k film is suppressed and a dry etching residue is removed; damage to a tungsten-containing material and a low-k film is suppressed and a dry etching residue is removed; or damage to a titanium-containing material, a tungsten-containing material, copper or a copper alloy and a low-k film is suppressed and a dry etching residue is removed, which is the purpose of the present invention (see Comparative Example 43).

Patent Document 21 proposes a wiring forming method using a cleaning solution containing an amine compound, a salt of hydroxylamine, a quaternary ammonium compound, an organic acid, a water-soluble organic solvent and water. When using this cleaning solution, it is possible to suppress damage to a tungsten-containing material and a titanium-containing material, but a residue cannot be removed, and damage to copper or a copper alloy and a low-k film cannot be suppressed. Accordingly, this cleaning solution cannot be used for cleaning a semiconductor element, wherein: damage to a titanium-containing material and a low-k film is suppressed and a dry etching residue is removed; damage to a tungsten-containing material and a low-k film is suppressed and a dry etching residue is removed; or damage to a titanium-containing material, a tungsten-containing material, copper or a copper alloy and a low-k film is suppressed and a dry etching residue is removed, which is the purpose of the present invention (see Comparative Example 44).

Patent Document 22 proposes a wiring forming method using a cleaning solution containing an alkali and $W_zMX_y$ (in the formula: M represents a metal selected from the group consisting of Si, Ge, Sn, Pt, P, B, Au, Ir, Os, Cr, Ti, Zr, Rh, Ru and Sb; X represents a halide selected from the group consisting of F, Cl, Br and I; W is selected from H, an alkali or alkaline earth metal, and a metal-ion-free hydroxide base moiety; y represents a number of from 4 to 6 depending on a metal halide; and z represents a number of 1, 2 or 3). When using the cleaning solution described in Patent Document 22, it is impossible to remove a dry etching residue, and it is impossible to suppress damage to a tungsten-containing material and a low-k film. Accordingly, this cleaning solution cannot be used for cleaning a semiconductor element, wherein damage to a tungsten-containing material and a low-k film is suppressed and a dry etching residue is removed, which is the purpose of the present invention (see Comparative Example 46). Further, a cleaning solution, in which WzMXy described in the Examples of Patent Document 22 is blended instead of the alkaline earth metal compound that is blended in the cleaning solution of the present invention for the purpose of suppressing damage to the titanium-containing material or the tungsten-containing material, cannot suppress damage to the titanium-containing material and the tungsten-containing material and damages the low-k film (see Comparative Example 47).

Patent Document 23 proposes a method for cleaning a semiconductor substrate using a cleaning solution containing a carbonate and an acidic compound and having a pH value of less than 7.5. Specific examples of the carbonate contained in the cleaning solution include carbonates containing an alkaline earth metal, and it is described that this cleaning solution suppresses corrosion of titanium nitride. However, when using the cleaning solution described in Patent Document 23, it is impossible to remove a dry etching residue, and it is impossible to suppress damage to a titanium-containing material, a tungsten-containing material and copper. Accordingly, this cleaning solution cannot be used for cleaning a semiconductor element, wherein: damage to a titanium-containing material and a low-k film is suppressed and a dry etching residue is removed; damage to a tungsten-containing material and a low-k film is suppressed and a dry etching residue is removed; or damage to a titanium-containing material, a tungsten-containing material, copper or a copper alloy and a low-k film is suppressed and a dry etching residue is removed, which is the purpose of the present invention (see Comparative Example 48). Further, a cleaning solution, in which the carbonate described in the Examples of Patent Document 23 is blended in the cleaning solution of the present invention instead of the alkaline earth metal compound that is blended for the purpose of suppressing damage to the material containing titanium or tungsten, cannot suppress damage to the titanium-containing material and the tungsten-containing material (see Comparative Example 49).

PRIOR ART DOCUMENTS

Patent Documents

Patent Document 1: Japanese Laid-Open Patent Publication No. 2009-75285
Patent Document 2: Japanese Laid-Open Patent Publication No. 2009-231354
Patent Document 3: Japanese Laid-Open Patent Publication No. 2012-046685
Patent Document 4: Japanese Laid-Open Patent Publication No. 2012-060050
Patent Document 5: Japanese Laid-Open Patent Publication No. H09-96911
Patent Document 6: Japanese Laid-Open Patent Publication No. 2003-316028
Patent Document 7: Japanese Laid-Open Patent Publication No. 2001-026890
Patent Document 8: Japanese Laid-Open Patent Publication No. 2008-285508
Patent Document 9: Japanese Laid-Open Patent Publication No. 2011-118101
Patent Document 10: Japanese Laid-Open Patent Publication No. 2009-21516
Patent Document 11: Japanese Laid-Open Patent Publication No. 2009-209431
Patent Document 12: Japanese Laid-Open Patent Publication No. 2009-527131
Patent Document 13: Japanese Laid-Open Patent Publication No. 2012-009513
Patent Document 14: Japanese Laid-Open Patent Publication No. 2003-257922
Patent Document 15: Japanese Laid-Open Patent Publication No. 2003-223010
Patent Document 16: Japanese Laid-Open Patent Publication No. H08-334905
Patent Document 17: Japanese Laid-Open Patent Publication No. H09-152721
Patent Document 18: International Publication WO2013/187313 pamphlet
Patent Document 19: Japanese National-phase PCT Laid-Open Patent Publication No. 2013-533631
Patent Document 20: Japanese Laid-Open Patent Publication No. 2007-298930
Patent Document 21: Japanese Laid-Open Patent Publication No. 2011-243610
Patent Document 22: Japanese National-phase PCT Laid-Open Patent Publication No. 2007-510307
Patent Document 23: Japanese Laid-Open Patent Publication No. 2011-228365

SUMMARY OF THE INVENTION

Problems to be Solved by the Invention

The purpose of the present invention is to provide a cleaning solution, which suppresses damage to at least a low-k film and a titanium-containing material and removes a dry etching residue and a photoresist on the surface of a product to be treated in the process for manufacturing a semiconductor element, and a cleaning method using the same.

Another purpose of the present invention is to provide a cleaning solution, which suppresses damage to at least a low-k film and a tungsten-containing material and removes a dry etching residue and a photoresist on the surface of a product to be treated in the process for manufacturing a semiconductor element, and a cleaning method using the same.

Yet another purpose of the present invention is to provide a cleaning solution, which suppresses damage to at least a low-k film, a titanium-containing material and a tungsten-containing material and removes a dry etching residue and a photoresist on the surface of a product to be treated in the process for manufacturing a semiconductor element, and a cleaning method using the same.

Means for Solving the Problems

The above-described problems can be solved by the present invention. Specifically, the present invention is as follows:
<1> A cleaning solution which removes a dry etching residue and a photoresist on a surface of a semiconductor element having a low dielectric constant film (a low-k film) and at least one material selected from a material that contains 10 atomic % or more of titanium and a material that contains 10 atomic % or more of tungsten, wherein the cleaning solution contains: 0.002 to 50% by mass of at least one type of oxidant selected from the group consisting of a peroxide, perchloric acid and a perchlorate salt; 0.000001 to 5% by mass of an alkaline earth metal compound; and water.

<2> The cleaning solution according to item <1>, wherein the pH value of the cleaning solution is 3 to 14.

<3> The cleaning solution according to item <1> or <2>, wherein the peroxide is at least one substance selected from the group consisting of hydrogen peroxide, urea peroxide, m-chloroperoxybenzoic acid, tert-butyl hydroperoxide, peracetic acid, di-tert-butyl peroxide, benzoyl peroxide, acetone peroxide, methyl ethyl ketone peroxide, hexamethylene triperoxide and cumene hydroperoxide.

<4> The cleaning solution according to item <1> or <2>, wherein the perchlorate salt is at least one substance selected from the group consisting of ammonium perchlorate, potassium perchlorate, calcium perchlorate, magnesium perchlorate, silver perchlorate, sodium perchlorate, barium perchlorate, lithium perchlorate, zinc perchlorate, acetylcholine perchlorate, lead perchlorate, rubidium perchlorate, cesium perchlorate, cadmium perchlorate, iron perchlorate, aluminium perchlorate, strontium perchlorate, tetrabutyl ammonium perchlorate, lanthanum perchlorate, indium perchlorate and tetra-n-hexylammonium perchlorate.

<5> The cleaning solution according to item <1>, wherein the oxidant is hydrogen peroxide and the pH value of the cleaning solution is 3 to 14.

<6> The cleaning solution according to any one of items <1> to <5>, wherein the pH value of the cleaning solution is 7 to 14.

<7> The cleaning solution according to any one of items <1> to <6>, wherein the material that contains 10 atomic % or more of titanium includes at least one substance selected from the group consisting of titanium oxide, titanium nitride, titanium and titanium silicide.

<8> The cleaning solution according to any one of items <1> to <6>, wherein the material that contains 10 atomic % or more of tungsten includes at least one substance selected from the group consisting of tungsten oxide, tungsten nitride, tungsten and tungsten silicide.

<9> The cleaning solution according to any one of items <1> to <8>, wherein the alkaline earth metal compound is at least one substance selected from the group consisting of a calcium compound, a strontium compound and a barium compound.

<10> A cleaning method for removing a dry etching residue and a photoresist on a surface of a semiconductor element having a low dielectric constant film (a low-k film) and at least one material selected from a material that contains 10 atomic % or more of titanium and a material that contains 10 atomic % or more of tungsten, said method comprising using the cleaning solution according to any one of items <1> to <9>.

Advantageous Effect of the Invention

By employing the cleaning solution of the present invention and the cleaning method using the same, it is possible to suppress damage to at least a low-k film and at least one material selected from between a titanium-containing material and a tungsten-containing material and selectively remove a dry etching residue and a photoresist on a surface of a product to be treated in the process for manufacturing a semiconductor element, and it is possible to produce a semiconductor element having high precision and high quality with a high yield.

BRIEF DESCRIPTION OF THE DRAWINGS

FIG. 1 is a schematic cross sectional view showing an example of the structure of a semiconductor element including a titanium-containing material and a low-k film prior to removal of a dry etching residue.

FIG. 2 is a schematic cross sectional view showing an example of the structure of a semiconductor element including a tungsten-containing material and a low-k film prior to removal of a dry etching residue.

FIG. 3 is a schematic cross sectional view showing an example of the structure of a semiconductor element including a titanium-containing material and a tungsten-containing material prior to removal of a dry etching residue.

FIG. 4 is a schematic cross sectional view showing an example of the structure of a semiconductor element including a titanium-containing material and a wiring made of copper or a copper alloy prior to removal of a dry etching residue.

FIG. 5 is a schematic cross sectional view showing an example of the structure of a semiconductor element including a titanium-containing material and a low-k film prior to removal of a dry etching residue and a photoresist.

FIG. 6 is a schematic cross sectional view showing an example of the structure of a semiconductor element including a tungsten-containing material and a low-k film prior to removal of a dry etching residue and a photoresist.

FIG. 7 is a schematic cross sectional view showing an example of the structure of a semiconductor element including a titanium-containing material and a tungsten-containing material prior to removal of a dry etching residue and a photoresist.

FIG. 8 is a schematic cross sectional view showing an example of the structure of a semiconductor element including a titanium-containing material and a wiring made of copper or a copper alloy prior to removal of a dry etching residue and a photoresist.

EMBODIMENTS FOR CARRYING OUT THE INVENTION

The cleaning solution of the present invention is used in the cleaning process in the production of a semiconductor element, and in this case, a dry etching residue and a photoresist can be cleaned/removed at a quite satisfactory level, and it is possible to suppress damage to at least a low-k film and at least one material selected from a titanium-containing material and a tungsten-containing material. The cleaning solution of the present invention can be used for a semiconductor element having a titanium-containing material, and can also be used for a semiconductor element having a tungsten-containing material, and further can be used for a semiconductor element having both the titanium-containing material and the tungsten-containing material. When a semiconductor element has both titanium and tungsten, the titanium and the tungsten are not required to be contained in the same layer constituting one semiconductor element, and may be respectively contained in different layers constituting one semiconductor element. According to the present invention, by using one cleaning solution, corrosion of titanium can be prevented in a layer containing the titanium, and corrosion of tungsten can be prevented in another layer containing the tungsten, and therefore it is significantly convenient. It is sufficient when the semiconductor element to which the cleaning solution of the present invention is applied includes at least one of titanium and tungsten, and a metal other than titanium and tungsten may be included therein.

The titanium-containing material included in the semiconductor element to which the cleaning solution of the present invention is applied is a material containing 10 atomic % or more of titanium, and the atomic composition percentage of titanium is preferably 15 atomic % or more, more preferably 20 atomic % or more, even more preferably 25 atomic % or more, and particularly preferably 30 atomic % or more.

In the present invention, the content of titanium can be examined by measuring the constituent ratio of titanium atoms in the targeted titanium-containing material according to the ion sputtering method of X-ray photoelectron spectroscopy (XPS). The vicinity of the surface of the titanium-containing material is oxidized, and therefore the constituent ratio of oxygen atoms therein may be higher than that in the inner part of the material. For this reason, the surface of the titanium-containing material is etched by ion sputtering until the constituent ratio of titanium atoms and oxygen atoms becomes constant, thereby measuring the constituent ratio of titanium atoms in the inner portion of the titanium-containing material exposed by ion sputtering. As a measurement apparatus, a fully automatic XPS analyzer K-Alpha (manufactured by Thermo Fisher Scientific Inc.) can be used.

Specific examples of the titanium-containing material include titanium oxide, titanium nitride, titanium and titanium silicide, and preferred are titanium oxide, titanium nitride and titanium. However, the titanium-containing material is not limited thereto as long as it is a material containing 10 atomic % or more of titanium.

The tungsten-containing material included in the semiconductor element to which the cleaning solution of the present invention is applied is a material containing 10 atomic % or more of tungsten, and the atomic composition percentage of tungsten is preferably 15 atomic % or more, more preferably 20 atomic % or more, even more preferably 25 atomic % or more, still more preferably 30 atomic % or more, particularly preferably 35 atomic % or more, and most preferably 40 atomic % or more.

In the present invention, the content of tungsten can be examined by measuring the constituent ratio of tungsten atoms in the targeted tungsten-containing material according to the ion sputtering method of XPS as described above. As a measurement apparatus, a fully automatic XPS analyzer K-Alpha (manufactured by Thermo Fisher Scientific Inc.) can be used.

Specific examples of the tungsten-containing material include tungsten oxide, tungsten nitride, tungsten and tungsten silicide, and preferred are tungsten oxide, tungsten nitride and tungsten. However, the tungsten-containing material is not limited thereto as long as it is a material containing 10 atomic % or more of tungsten.

The semiconductor element to which the cleaning solution of the present invention is applied may include copper or a copper alloy. Specific examples of copper and the copper alloy include copper, aluminium copper, manganese copper, nickel copper, titanium copper, gold copper, silver copper, tungsten copper, copper silicide, cobalt copper and zinc copper, and preferred are copper, aluminium copper, manganese copper, nickel copper and titanium copper. However, copper and the copper alloy are not limited thereto.

The concentration of the alkaline earth metal compound contained in the cleaning solution of the present invention is 0.000001 to 5% by mass, preferably 0.000005 to 1% by mass, even more preferably 0.00005 to 0.7% by mass, and particularly preferably 0.0005 to 0.5% by mass. When the concentration is within the above-described range, corrosion of at least one material selected from the titanium-containing material and the tungsten-containing material can be effectively prevented. When the concentration of the alkaline earth metal compound exceeds 5% by mass, removability of the dry etching residue may be reduced.

The present inventors found for the first time that the alkaline earth metal compound contained in the cleaning solution exerts anticorrosive effects on at least one material selected from the titanium-containing material and the tungsten-containing material. The mechanism thereof has not been elucidated, but it is considered that the alkaline earth metal compound adsorbs to the surface of titanium or tungsten, thereby preventing corrosion of titanium or tungsten caused by an oxidant such as hydrogen peroxide and an alkali contained in the cleaning solution.

Specific examples of the alkaline earth metal compound include a calcium compound, a strontium compound and a barium compound. More specific examples thereof include, but are not limited to, barium nitrate, barium hydroxide, barium chloride, barium acetate, barium oxide, barium bromide, barium carbonate, barium fluoride, barium iodide, barium sulfate, barium phosphate, calcium nitrate, calcium chloride, calcium acetate, calcium oxide, calcium bromide, calcium carbonate, calcium fluoride, calcium iodide, calcium sulfate, calcium phosphate, strontium nitrate, strontium chloride, strontium acetate, strontium oxide, strontium bromide, strontium carbonate, strontium fluoride, strontium iodide, strontium sulfate and strontium phosphate. Among them, barium nitrate, barium hydroxide, barium chloride, calcium nitrate and strontium chloride are more preferred, and barium nitrate, barium hydroxide, barium chloride and calcium nitrate are particularly preferred. These alkaline earth metal compounds may be used solely, or two or more of them may be used in combination.

The concentration of at least one type of oxidant selected from the group consisting of a peroxide, perchloric acid and a perchlorate salt contained in the cleaning solution of the present invention is 0.002 to 50% by mass, preferably 0.01 to 30% by mass, more preferably 0.1 to 25% by mass, and particularly preferably 0.3 to 25% by mass. When the concentration is within the above-described range, the dry etching residue can be effectively removed.

The peroxide to be used in the present invention is a compound having a structure of (—O—O—) (O is an oxygen atom). Specific examples of the peroxide include, but are not limited to, hydrogen peroxide, urea peroxide, m-chloroperoxybenzoic acid, tert-butyl hydroperoxide, peracetic acid, di-tert-butyl peroxide, benzoyl peroxide, acetone peroxide, methyl ethyl ketone peroxide, hexamethylene triperoxide and cumene hydroperoxide. Among them, hydrogen peroxide, m-chloroperoxybenzoic acid and tert-butyl hydroperoxide are more preferred. These peroxides may be used solely, or two or more of them may be used in combination.

An inorganic peroxide reacts with water, resulting in the generation of hydrogen peroxide in the cleaning solution, and therefore the inorganic peroxide is substantially equivalent to hydrogen peroxide. For this reason, the inorganic peroxide may be added to the cleaning solution in order to generate hydrogen peroxide therein. Specific examples of the inorganic peroxide include, but are not limited to, lithium peroxide, potassium peroxide, sodium peroxide, rubidium peroxide, cesium peroxide, beryllium peroxide, magnesium peroxide, calcium peroxide, strontium peroxide, barium peroxide, zinc peroxide, cadmium peroxide and copper peroxide.

Specific examples of the perchloric acid or the perchlorate salt to be used in the present invention include, but are not limited to, perchloric acid, ammonium perchlorate, potassium perchlorate, calcium perchlorate, magnesium perchlorate, silver perchlorate, sodium perchlorate, barium perchlorate, lithium perchlorate, zinc perchlorate, acetylcholine perchlorate, lead perchlorate, rubidium perchlorate, cesium perchlorate, cadmium perchlorate, iron perchlorate, aluminium perchlorate, strontium perchlorate, tetrabutylammonium perchlorate, lanthanum perchlorate, indium perchlorate and tetra-n-hexylammonium perchlorate. Among them, ammonium perchlorate is more preferred. These substances may be used solely, or two or more of them may be used in combination.

The water to be used in the present invention is preferably water from which metal ions, organic impurities, particles, etc have been removed by distillation, ion exchange treatment, filtering treatment, adsorption treatment or the like, and pure water and ultrapure water are particularly preferred. The concentration of water means the remaining portion of the cleaning solution from which agents are excluded.

For the purpose of suppressing damage to the low-k film and the titanium-containing material and removing the dry etching residue on the surface of the product to be treated, the cleaning solution of the present invention can be used at a pH value of 0 to 14. The pH value is preferably 0.2 to 14, more preferably 0.6 to 13.1, even more preferably 1.5 to 12.8, and particularly preferably 2 to 12.5. When the pH value is within the above-described range, damage to the low-k film and the titanium-containing material can be suppressed, and the dry etching residue on the surface of the product to be treated can be selectively removed.

For the purpose of suppressing damage to the low-k film and the tungsten-containing material and removing the dry etching residue on the surface of the product to be treated, the cleaning solution of the present invention can be used at a pH value of 0 to 14. The pH value is preferably 3 to 14, more preferably 5 to 13.1, even more preferably 7.7 to 12.8, and particularly preferably 8 to 12. When the pH value is within the above-described range, damage to the low-k film and the tungsten-containing material can be suppressed, and the dry etching residue on the surface of the product to be treated can be selectively removed.

For the purpose of suppressing damage to the low-k film, the titanium-containing material, the tungsten-containing material and copper or the copper alloy and removing the dry etching residue on the surface of the product to be treated, the cleaning solution of the present invention can be used at a pH value of 3 to 14. The pH value is preferably 4 to 14, more preferably 5 to 12.8, even more preferably 7.7 to 12.8, and particularly preferably 8 to 12. When the pH value is within the above-described range, damage to the low-k film, the titanium-containing material, the tungsten-containing material and copper or the copper alloy can be suppressed, and the dry etching residue on the surface of the product to be treated can be selectively removed.

The photoresist can be removed at any pH value. The pH value is preferably 7 to 14, more preferably 7.5 to 14, even more preferably 7.7 to 13.1, still more preferably 8.6 to 12.8, and particularly preferably 9 to 12.8.

The cleaning solution of the present invention may contain a pH adjuster. As the pH adjuster, an inorganic acid, an organic acid, an inorganic alkali and an organic alkali can be arbitrarily used. Specific examples thereof include, but are not limited to, sulfuric acid, nitric acid, phosphoric acid, fluoric acid, hydrochloric acid, acetic acid, citric acid, formic acid, malonic acid, lactic acid, oxalic acid, potassium hydroxide, potassium acetate, potassium carbonate, potassium phosphate, sodium hydroxide, lithium hydroxide, cesium hydroxide, triethylamine, ammonia, tetramethylammonium hydroxide, ethanolamine and 1-amino-2-propanol. These pH adjusters may be used solely, or two or more of them may be used in combination.

In the cleaning solution of the present invention, if desired, an additive which is conventionally used in semiconductor cleaning solutions may be blended within a range in which the purpose of the present invention is not impaired. For example, an oxidant other than the peroxide, perchloric acid and perchlorate salt, a metal anticorrosive, a water-soluble organic solvent, a fluorine compound, a reducing agent, a chelating agent, a surfactant, a defoaming agent, etc. may be added.

The temperature at which the cleaning solution of the present invention is used is 10 to 85° C., preferably 20 to 70° C., and may be appropriately selected depending on etching conditions and a semiconductor element to be used.

With the cleaning method of the present invention, ultrasonic may be used in combination according to need.

The time for use of the cleaning solution of the present invention is 0.1 to 120 minutes, preferably 0.5 to 60 minutes, and may be appropriately selected depending on etching conditions and a semiconductor element to be used.

As a rinse liquid to be used after use of the cleaning solution of the present invention, an organic solvent such as alcohol can be used, but it is sufficient to just rinse the semiconductor element with water.

As a general low-k film, a hydroxysilsesquioxane (HSQ)-based or methylsilsesquioxane (MSQ)-based OCD (trade name, manufactured by Tokyo Ohka Kogyo Co., Ltd.), a carbon-doped silicon oxide (SiOC)-based Black Diamond (trade name, manufactured by Applied Materials), Aurora (trade name, manufactured by ASM International), Coral (trade name, manufactured by Novellus Systems) and an inorganic Orion (trade name, manufactured by Trikon Tencnlogies) can be used, but the low-k film is not limited thereto.

The semiconductor element and the display element to which the cleaning solution of the present invention is applied include: a substrate material such as silicon, amorphous silicon, polysilicon and glass; an insulating material such as silicon oxide, silicon nitride, silicon carbide and derivatives thereof; a material such as cobalt, cobalt alloy, tungsten and titanium-tungsten; a compound semiconductor such as gallium-arsenic, gallium-phosphorus, indium-phosphorus, indium-gallium-arsenic and indium-aluminium-arsenic; an oxide semiconductor such as chromium oxide; etc.

The semiconductor element to which the cleaning solution of the present invention is applied may include a barrier metal and/or a barrier insulating film.

As a general barrier metal, tantalum, tantalum nitride, titanium, titanium nitride, ruthenium, manganese, magnesium and oxides thereof can be used, but the barrier metal is not limited thereto.

As a general barrier insulating film, silicon nitride, silicon carbide and silicon carbonitride can be used, but the barrier insulating film is not limited thereto.

EXAMPLES

Hereinafter, the present invention will be described in more detail based on Examples and Comparative Examples, but the present invention is not limited by the Examples.

SEM Observation:

Observation of conditions before and after the cleaning/removal treatment of the semiconductor element was carried out using the below-described SEM (scanning electron microscope) apparatus (100,000 x).

Measurement apparatus: ultra-high resolution field-emission scanning electron microscope SU9000 manufactured by Hitachi High-Technologies Corporation Judgment:

The judgment after cleaning/removal was made after SEM observation based on the below-described criteria.

I. Removal State of Dry Etching Residue
  E: The dry etching residue was completely removed.
  G: The dry etching residue was almost removed.
  P: The dry etching residue was insufficiently removed.
  E and G are regarded as acceptable.

II. Damage to Titanium-Containing Material
  E: The titanium-containing material showed no change compared to that prior to cleaning.
  G: There was a slightly rough portion on the surface of the titanium-containing material.
  P: The titanium-containing material showed peeling or change in its shape.
  E and G are regarded as acceptable.

III. Damage to Low-k Film
  E: The low-k film showed no change compared to that prior to cleaning.
  G: There was a slightly rough portion on the surface of the low-k film.
  P: There was a significantly concave portion in the low-k film.
  E and G are regarded as acceptable.

IV. Damage to Tungsten-Containing Material
  E: The tungsten-containing material showed no change compared to that prior to cleaning.
  G: There was a slightly rough portion on the surface of the tungsten-containing material.
  P: There was a big hole in the tungsten-containing material.
  E and G are regarded as acceptable.

V. Damage to Copper
  E: The copper showed no change compared to that prior to cleaning.
  G: There was a slightly rough portion on the surface of the copper.
  P: The copper showed change compared to that prior to cleaning.
  E and G are regarded as acceptable.

VI. Removal State of Photoresist
  E: The photoresist was completely removed.
  G: The photoresist was almost removed.
  P: The photoresist was insufficiently removed.
  E and G are regarded as acceptable.

Compositions of cleaning solutions used in Examples are shown in Table 1, and compositions of cleaning solutions used in Comparative Examples are shown in Tables 7 and 8.

A semiconductor element having a wiring structure whose cross-sectional surface is as shown in any of FIGS. 1 to 8 was used in the test to examine cleaning effects. The semiconductor element was immersed in a cleaning solution at a predetermined temperature and for a predetermined period of time. After that, rinsing with ultrapure water and drying by dry nitrogen gas jet were carried out. The semiconductor element after cleaning was observed by SEM to judge the removal state of the dry etching residue or photoresist and damage to respective materials. The titanium-containing material used in the test was titanium oxide, and 30 atomic % of titanium was contained. Further, the tungsten-containing material used in the test was tungsten oxide, and 40 atomic % of tungsten was contained.

The content of titanium was measured according to the ion sputtering method of X-ray photoelectron spectroscopy (XPS) as described above. Further, the content of tungsten was also measured according to the ion sputtering method of XPS as described above. In each case, as a measurement apparatus, a fully automatic XPS analyzer K-Alpha (manufactured by Thermo Fisher Scientific Inc.) was used.

Examples 1-22

The semiconductor element shown in FIG. 1 was cleaned with the cleaning solution of the present invention shown in Table 1. The results are shown in Table 2. It is understood that in Examples 1-22, damage to the titanium-containing material 1 and the low-k film 2 was prevented while the dry etching residue 3 was completely removed.

Examples 23-41

The semiconductor element shown in FIG. 2 was cleaned with the cleaning solution of the present invention shown in Table 1. The results are shown in Table 3. It is understood that in Examples 23-41, damage to the tungsten-containing material 4 and the low-k film 2 was prevented while the dry etching residue 3 was completely removed.

Examples 42-59

The semiconductor elements shown in FIGS. 3 and 4 were cleaned with the cleaning solution of the present invention shown in Table 1. The results are shown in Table 4. It is understood that in Examples 42-59, damage to the titanium-containing material 1, the tungsten-containing material 4, copper 5 and the low-k film 2 was prevented while the dry etching residue 3 was completely removed.

Examples 60-62

The semiconductor elements shown in FIGS. 5, 6 and 7 were cleaned with the cleaning solution of the present invention shown in Table 1. The results are shown in Table 5. It is understood that in Examples 60-62, the photoresist 8 was completely removed.

Examples 63-79

The semiconductor elements shown in FIGS. 5, 6, 7 and 8 were cleaned with the cleaning solution of the present invention shown in Table 1. The results are shown in Table 6. It is understood that in Examples 63-79, the photoresist 8 was completely removed.

In Examples 42-59 shown in Table 4 and Examples 63-79 shown in Table 6, damage to the barrier metal 6 and the barrier insulating film 7 was successfully suppressed.

Comparative Examples 1-18

The semiconductor element shown in FIG. 1 was cleaned with a cleaning solution (Table 7, cleaning solutions 2A to 2R) in which barium nitrate was not added in the cleaning solution used in Examples 1-18 (Table 1, cleaning solutions 1A to 1R). Cleaning conditions and results of cleaning are shown in Table 9. When compared to the cleaning solutions in which barium nitrate was added to the cleaning solutions 2A to 2R shown in Comparative Examples 1-18 (Table 1, cleaning solutions 1A to 1R), there was no difference of removability of the dry etching residue 3 (FIG. 1), but the titanium-containing material 1 (FIG. 1) was damaged in each case. Accordingly, it is understood that the cleaning solutions 2A to 2R cannot be used for the purpose of the present application of suppressing damage to the titanium-containing material and the low-k film and removing the dry etching residue on the surface of the product to be treated in the process for manufacturing the semiconductor element that is the target of the present invention (Table 9). In addition, according to these and Examples 19-22, it is understood that the alkaline earth metal compound is useful for suppressing damage to the titanium-containing material without deterioration of removability of the dry etching residue 3.

The semiconductor element shown in FIG. 2 was cleaned with a cleaning solution (Table 7, cleaning solutions 2A, 2B, 2D to 2J, and 2M to 2R) in which barium nitrate was not added in the cleaning solution used in Examples 23-37 (Table 1, cleaning solutions 1A, 1B, 1D to 1J, and 1M to 1R). Cleaning conditions and results of cleaning are shown in Table 9. When compared to the cleaning solutions in which barium nitrate was added to the cleaning solutions 2A, 2B, 2D to 2J and 2M to 2R shown in Comparative Examples 1, 2, 4-10 and 13-18 (Table 1, cleaning solutions 1A, 1B, 1D to 1J, and 1M to 1R), there was no difference of removability of the dry etching residue 3 (FIG. 2), but the tungsten-containing material 4 (FIG. 2) was damaged in each case. Accordingly, it is understood that the cleaning solutions 2A, 2B, 2D to 2J and 2M to 2R cannot be used for the purpose of the present application of suppressing damage to the tungsten-containing material and the low-k film and removing the dry etching residue on the surface of the product to be treated in the process for manufacturing the semiconductor element that is the target of the present invention (Table 9). In addition, according to these and Examples 38-41, it is understood that the alkaline earth metal compound is useful for suppressing damage to the tungsten-containing material without deterioration of removability of the dry etching residue 3.

Comparative Examples 19 and 20 (the Invention Described in Patent Document 1)

The semiconductor element shown in FIG. 1 was cleaned with a cleaning solution containing 12% by mass of tetramethylammonium hydroxide, 5% by mass of hydrogen peroxide, 2% by mass of potassium hydroxide, 35% by mass of triethanolamine and 46% by mass of water (Table 8, cleaning solution 2S). Cleaning conditions and evaluation results are shown in Table 9. When cleaning the semiconductor element with this cleaning solution for 40 minutes, the residue was successfully removed without damage to the low-k film, but the titanium-containing material was damaged (Comparative Example 19). When the immersion time was decreased to 20 minutes in order to suppress damage to the titanium-containing material, the low-k film was not damaged, but it was impossible to remove the residue and the titanium-containing material was damaged (Comparative Example 20). Accordingly, it is understood that the cleaning solution 2S cannot be used for the purpose of the present application of suppressing damage to the titanium-containing material and removing the dry etching residue on the surface of the product to be treated in the process for manufacturing the semiconductor element that is the target of the present invention.

Comparative Examples 21 and 22 (the Invention Described in Patent Document 2)

The semiconductor element shown in FIG. 1 was cleaned with a cleaning solution containing 3% by mass of sodium hydroxide, 2% by mass of hydrogen peroxide, 0.05% by mass of polypropylene glycol (number-average molecular weight: 400) and 94.95% by mass of water (Table 8, cleaning solution 2T). Cleaning conditions and evaluation results are shown in Table 9. When cleaning the semiconductor element with this cleaning solution for 40 minutes, the residue was successfully removed without damage to the low-k film, but the titanium-containing material was damaged (Comparative Example 21). When the immersion time was decreased to 20 minutes in order to suppress damage to the titanium-containing material, the low-k film was not damaged, but it was impossible to remove the residue and the titanium-containing material was damaged (Comparative Example 22). Accordingly, it is understood that the cleaning solution 2T cannot be used for the purpose of the present application of suppressing damage to the titanium-containing material and removing the dry etching residue on the surface of the product to be treated in the process for manufacturing the semiconductor element that is the target of the present invention.

Comparative Example 23 (the Invention Described in Patent Document 3)

The semiconductor element shown in FIG. 1 was cleaned with a cleaning solution containing 4% by mass of hydroxylamine sulfate, 3.8% by mass of tetramethylammonium hydroxide, 1% by mass of citric acid, 1% by mass of 2-methylimidazole and 90.2% by mass of water (Table 8, cleaning solution 2U). Cleaning conditions and evaluation results are shown in Table 9. When using this cleaning solution, damage to the titanium-containing material was successfully suppressed, but it was impossible to remove the residue and the low-k film was damaged. Accordingly, it is understood that the cleaning solution 2U cannot be used for the purpose of the present application of suppressing damage to the titanium-containing material and removing the dry etching residue on the surface of the product to be treated in the process for manufacturing the semiconductor element that is the target of the present invention.

Comparative Example 24 (the Invention Described in Patent Document 4)

The semiconductor element shown in FIG. 1 was cleaned with a cleaning solution containing 4% by mass of hydroxylamine sulfate, 4.7% by mass of tetramethylammonium hydroxide, 1% by mass of acetic acid, 2% by mass of hydroxylethylmorpholine and 88.3% by mass of water (Table 8, cleaning solution 2V). Cleaning conditions and evaluation results are shown in Table 9. When using this cleaning solution, damage to the titanium-containing material was successfully suppressed, but it was impossible to remove the residue and the low-k film was damaged. Accordingly, it is understood that the cleaning solution 2V cannot be used for the purpose of the present application of suppressing damage to the titanium-containing material and removing the dry etching residue on the surface of the product to be treated in the process for manufacturing the semiconductor element that is the target of the present invention.

Comparative Example 25 (the Invention Described in Patent Document 5)

The semiconductor element shown in FIG. 1 was cleaned with a cleaning solution containing 15% by mass of hydroxylamine, 10% by mass of monoethanolamine, 55% by mass of dimethyl sulfoxide, 5% by mass of catechol and 15% by mass of water (Table 8, cleaning solution 2W). Cleaning conditions and evaluation results are shown in Table 9. When using this cleaning solution, damage to the titanium-containing material was successfully suppressed, but it was impossible to remove the residue and the low-k film was damaged. Accordingly, it is understood that the cleaning solution 2W cannot be used for the purpose of the present application of suppressing damage to the titanium-containing material and removing the dry etching residue on the surface of the product to be treated in the process for manufacturing the semiconductor element that is the target of the present invention.

Comparative Example 26 (the Invention Described in Patent Document 6)

The semiconductor element shown in FIG. 2 was cleaned with a cleaning solution containing 1.35% by mass of phosphoric acid, 1% by mass of hydrochloric acid, 5% by mass of tetramethylammonium hydroxide, 0.01% by mass of sodium lauryl diaminoethyl glycinate and 92.64% by mass of water (Table 8, cleaning solution 2X). Cleaning conditions and evaluation results are shown in Table 9. When using this cleaning solution, damage to the tungsten-containing material was successfully suppressed, but it was impossible to remove the residue and the low-k film was damaged. Accordingly, it is understood that the cleaning solution 2X cannot be used for the purpose of the present application of suppressing damage to the tungsten-containing material and the low-k film and removing the dry etching residue on the surface of the product to be treated in the process for manufacturing the semiconductor element that is the target of the present invention.

Comparative Examples 27 and 28 (the Invention Described in Patent Document 7)

The semiconductor element shown in FIG. 2 was cleaned with a cleaning solution containing 5% by mass of hydrogen peroxide, 0.01% by mass of aminotriazole and 94.99% by mass of water (Table 8, cleaning solution 2Y). Cleaning conditions and evaluation results are shown in Table 9. When cleaning the semiconductor element with this cleaning solution for 30 minutes, the residue was successfully removed without damage to the low-k film, but the tungsten-containing material was damaged (Comparative Example 27). When the immersion time was decreased to 5 minutes in order to suppress damage to the tungsten-containing material, the low-k film was not damaged, but it was impossible to remove the residue and the tungsten-containing material was damaged (Comparative Example 28). Accordingly, it is understood that the cleaning solution 2Y cannot be used for the purpose of the present application of suppressing damage to the tungsten-containing material and the low-k film and removing the dry etching residue on the surface of the product to be treated in the process for manufacturing the semiconductor element that is the target of the present invention.

Comparative Examples 29 and 30 (the Invention Described in Patent Document 8)

The semiconductor element shown in FIG. 2 was cleaned with a cleaning solution containing 15% by mass of hydrogen peroxide, 0.2% by mass of benzyltrimethylammonium hydroxide, 0.001% by mass of Ethoquad O/12 [oleylbis(2-hydroxyethyl)methylammonium-bis(trifluoromethanesulfonyl)imide] (manufactured by Lion Corporation) and 84.799% by mass of water (Table 8, cleaning solution 2Z). Cleaning conditions and evaluation results are shown in Table 9. When cleaning the semiconductor element with this cleaning solution for 30 minutes, the residue was successfully removed without damage to the low-k film, but the tungsten-containing material was damaged (Comparative Example 30). When the immersion time was decreased to 10 minutes in order to suppress damage to the tungsten-containing material, the low-k film was not damaged, but it was impossible to remove the residue and the tungsten-containing material was damaged (Comparative Example 29). Accordingly, it is understood that the cleaning solution 2Z cannot be used for the purpose of the present application of suppressing damage to the tungsten-containing material and the low-k film and removing the dry etching residue on the surface of the product to be treated in the process for manufacturing the semiconductor element that is the target of the present invention.

Comparative Example 31 (the Invention Described in Patent Document 9)

The semiconductor element shown in FIG. 2 was cleaned with a cleaning solution containing 10% by mass of tetraethylammonium hydroxide, 0.02% by mass of sodium hydroxide, 2% by mass of 2-ethyl-4-methylimidazole, 40% by mass of dimethyl sulfoxide and 47.98% by mass of water (Table 8, cleaning solution 2AA). Cleaning conditions and evaluation results are shown in Table 9. When using this cleaning solution, damage to the tungsten-containing material was successfully suppressed, but it was impossible to remove the residue and the low-k film was damaged. Accordingly, it is understood that the cleaning solution 2AA cannot be used for the purpose of the present application of suppressing damage to the tungsten-containing material and the low-k film and removing the dry etching residue on the surface of the product to be treated in the process for manufacturing the semiconductor element that is the target of the present invention.

Comparative Examples 32 and 33 (the Invention Described in Patent Document 10)

The semiconductor element shown in FIG. 2 was cleaned with a cleaning solution containing 14% by mass of hydrogen peroxide, 0.3% by mass of hydrofluoric acid, 58.4% by mass of diethylene glycol monomethyl ether, 1% by mass of vinylimidazole and 26.3% by mass of water (Table 8, cleaning solution 2AB). Cleaning conditions and evaluation results are shown in Table 9. When cleaning the semiconductor element with this cleaning solution for 30 minutes, the residue was successfully removed, but the tungsten-containing material and the low-k film were damaged (Comparative Example 33). When the immersion time was decreased to 10 minutes in order to suppress damage to the tungsten-containing material and the low-k film, it was impossible to remove the residue and the tungsten-containing material and the low-k film were damaged (Comparative Example 32). Accordingly, it is understood that the cleaning solution 2AB cannot be used for the purpose of the present application of suppressing damage to the tungsten-containing material and the low-k film and removing the dry etching residue on the surface of the product to be treated in the process for manufacturing the semiconductor element that is the target of the present invention.

Comparative Example 34 (the Invention Described in Patent Document 11)

The semiconductor element shown in FIG. 2 was cleaned with a cleaning solution containing 0.3% by mass of hydrofluoric acid, 60% by mass of diethylene glycol monomethyl ether, 1% by mass of 2-ethyl-4-methylimidazole and 38.7% by mass of water (Table 8, cleaning solution 2AC). Cleaning conditions and evaluation results are shown in Table 9. When using this cleaning solution, damage to the tungsten-containing material was successfully suppressed, but it was impossible to remove the residue and the low-k film was damaged. Accordingly, it is understood that the cleaning solution 2AC cannot be used for the purpose of the present application of suppressing damage to the tungsten-containing material and the low-k film and removing the dry etching residue on the surface of the product to be treated in the process for manufacturing the semiconductor element that is the target of the present invention.

Comparative Example 35 (the Invention Described in Patent Document 12)

The semiconductor element shown in FIG. 2 was cleaned with a cleaning solution containing 0.1% by mass of hydrofluoric acid, 0.1% by mass of aminopropyltrimethoxysilane, 0.1% by mass of benzotriazole, 1% by mass of ethanol, 1% by mass of acetic acid and 97.7% by mass of water (Table 8, cleaning solution 2AD). Cleaning conditions and evaluation results are shown in Table 9. When using this cleaning solution, damage to the tungsten-containing material was successfully suppressed, but it was impossible to remove the residue and the low-k film was damaged. Accordingly, it is understood that the cleaning solution 2AD cannot be used for the purpose of the present application of suppressing damage to the tungsten-containing material and the low-k film and removing the dry etching residue on the surface of the product to be treated in the process for manufacturing the semiconductor element that is the target of the present invention.

Comparative Example 36 (the Invention Described in Patent Document 13)

The semiconductor element shown in FIG. 2 was cleaned with a cleaning solution containing 2% by mass of hydroxylamine sulfate, 3.4% by mass of tetramethylammonium hydroxide, 2% by mass of citric acid, 0.5% by mass of sorbitol and 92.1% by mass of water (Table 8, cleaning solution 2AE). Cleaning conditions and evaluation results are shown in Table 9. When using this cleaning solution, damage to the low-k film was successfully suppressed, but it was impossible to remove the residue and the tungsten-containing material was damaged. Accordingly, it is understood that the cleaning solution 2AE cannot be used for the purpose of the present application of suppressing damage to the tungsten-containing material and the low-k film and removing the dry etching residue on the surface of the product to be treated in the process for manufacturing the semiconductor element that is the target of the present invention.

Comparative Example 37 (the Inventions Described in Patent Documents 14 and 15)

The semiconductor element shown in FIG. 2 was cleaned with a cleaning solution containing 5% by mass of ammonium acetate, 0.8% by mass of glycine, 0.18% by mass of ammonia, 3.6% by mass of dimethyl sulfoxide and 90.42% by mass of water (Table 8, cleaning solution 2AF). Cleaning conditions and evaluation results are shown in Table 9. When using this cleaning solution, damage to the tungsten-containing material was successfully suppressed, but it was impossible to remove the residue and the low-k film was damaged. Accordingly, it is understood that the cleaning solution 2AF cannot be used for the purpose of the present application of suppressing damage to the tungsten-containing material and the low-k film and removing the dry etching residue on the surface of the product to be treated in the process for manufacturing the semiconductor element that is the target of the present invention.

Comparative Example 38

The semiconductor elements shown in FIGS. 3 and 4 were cleaned with a cleaning solution containing 4.5% by mass of potassium hydroxide, 0.003% by mass of barium nitrate and 95.497% by mass of water (Table 8, cleaning solution 2AG). As the wiring material, tungsten is used in the semiconductor element of FIG. 3, and copper is used in the semiconductor element of FIG. 4. Cleaning conditions and evaluation results are shown in Table 9. When using this cleaning solution, damage to the titanium-containing material, the tungsten-containing material and copper was successfully suppressed, but it was impossible to remove the residue and the low-k film was damaged. Accordingly, it is understood that the cleaning solution 2AG cannot be used for the purposes of the present application of: suppressing damage to the low-k film and the titanium-containing material and removing the dry etching residue on the surface of the product to be treated; suppressing damage to the low-k film and the tungsten-containing material and removing the dry etching residue on the surface of the product to be treated; and suppressing damage to the low-k film, the titanium-containing material, the tungsten-containing material and the copper or copper alloy and removing the dry etching residue on the surface of the product to be treated, in the process for manufacturing the semiconductor element that is the target of the present invention.

Comparative Example 39 (the Invention Described in Patent Document 16)

The semiconductor elements shown in FIGS. 3 and 4 were cleaned with a cleaning solution containing 10% by mass of N,N-diethylhydroxylamine, 15% by mass of hydroxylamine, 50% by mass of dimethyl sulfoxide, 10% by mass of catechol and 15% by mass of water (Table 8, cleaning solution 2AH). Cleaning conditions and evaluation results are shown in Table 9. When using this cleaning solution, damage to the tungsten-containing material was successfully suppressed, but it was impossible to remove the dry etching residue and the low-k film, the titanium-containing material and the copper were damaged. Accordingly, it is understood that the cleaning solution 2AH cannot be used for the purposes of the present application of: suppressing damage to the low-k film and the titanium-containing material and removing the dry etching residue on the surface of the product to be treated; suppressing damage to the low-k film and the tungsten-containing material and removing the dry etching residue on the surface of the product to be treated; and suppressing damage to the low-k film, the titanium-containing material, the tungsten-containing material and the copper or copper alloy and removing the dry etching residue on the surface of the product to be treated, in the process for manufacturing the semiconductor element that is the target of the present invention.

Comparative Example 40 (the Invention Described in Patent Document 17)

The semiconductor elements shown in FIGS. 3 and 4 were cleaned with a cleaning solution containing 10% by mass of monoethanolamine, 10% by mass of N,N-diethylhydroxylamine, 30% by mass of diethylene glycol monobutyl ether, 10% by mass of sorbitol and 40% by mass of water (Table 8, cleaning solution 2AI). Cleaning conditions and evaluation results are shown in Table 9. When using this cleaning solution, damage to the titanium-containing material, the tungsten-containing material and the copper was successfully suppressed, but it was impossible to remove the dry etching residue and the low-k film was damaged. Accordingly, it is understood that the cleaning solution 2AI cannot be used for the purposes of the present application of: suppressing damage to the low-k film and the titanium-containing material and removing the dry etching residue on the surface of the product to be treated; suppressing damage to the low-k film and the tungsten-containing material and removing the dry etching residue on the surface of the product to be treated; and suppressing damage to the low-k film, the titanium-containing material, the tungsten-containing material and the copper or copper alloy and removing the dry etching residue on the surface of the product to be treated, in the process for manufacturing the semiconductor element that is the target of the present invention.

Comparative Example 41 (the Invention Described in Patent Document 18)

The semiconductor elements shown in FIGS. 3 and 4 were cleaned with a cleaning solution containing 0.005% by mass of potassium hydroxide, 10% by mass of tetramethylammonium hydroxide, 50% by mass of diethylene glycol monomethyl ether, 0.1% by mass of pyrazole and 39.895% by mass of water (Table 8, cleaning solution 2AJ). Cleaning conditions and evaluation results are shown in Table 9. When using this cleaning solution, damage to the titanium-containing material, the tungsten-containing material and the copper was successfully suppressed, but it was impossible to remove the dry etching residue and the low-k film was damaged. Accordingly, it is understood that the cleaning solution 2AJ cannot be used for the purposes of the present application of: suppressing damage to the low-k film and the titanium-containing material and removing the dry etching residue on the surface of the product to be treated; suppressing damage to the low-k film and the tungsten-containing material and removing the dry etching residue on the surface of the product to be treated; and suppressing damage to the low-k film, the titanium-containing material, the tungsten-containing material and the copper or copper alloy and removing the dry etching residue on the surface of the product to be treated, in the process for manufacturing the semiconductor element that is the target of the present invention.

Comparative Example 42 (the Invention Described in Patent Document 19)

The semiconductor elements shown in FIGS. 3 and 4 were cleaned with a cleaning solution containing 0.1% by mass of benzotriazole, 0.1% by mass of 1,2,4-triazole, 5% by mass of ammonium fluoride, 1% by mass of boric acid and 93.8% by mass of water (Table 8, cleaning solution 2AK). Cleaning conditions and evaluation results are shown in Table 9. When using this cleaning solution, damage to the titanium-containing material, the tungsten-containing material and the copper was successfully suppressed, but it was impossible to remove the dry etching residue and the low-k film was damaged. Accordingly, it is understood that the cleaning solution 2AK cannot be used for the purposes of the present application of: suppressing damage to the low-k film and the titanium-containing material and removing the dry etching residue on the surface of the product to be treated; suppressing damage to the low-k film and the tungsten-containing material and removing the dry etching residue on the surface of the product to be treated; and suppressing damage to the low-k film, the titanium-containing material, the tungsten-containing material and the copper or copper alloy and removing the dry etching residue on the surface of the product to be treated, in the process for manufacturing the semiconductor element that is the target of the present invention.

Comparative Example 43 (the Invention Described in Patent Document 20)

The semiconductor elements shown in FIGS. 3 and 4 were cleaned with a cleaning solution containing 0.25% by mass of ammonium fluoride, 0.06% by mass of gluconic acid and 99.69% by mass of water (Table 8, cleaning solution 2AL). Cleaning conditions and evaluation results are shown in Table 9. When using this cleaning solution, damage to the titanium-containing material, the tungsten-containing material and the copper was successfully suppressed, but it was impossible to remove the dry etching residue and the low-k film was damaged. Accordingly, it is understood that the cleaning solution 2AL cannot be used for the purposes of the present application of: suppressing damage to the low-k film and the titanium-containing material and removing the dry etching residue on the surface of the product to be treated; suppressing damage to the low-k film and the tungsten-containing material and removing the dry etching residue on the surface of the product to be treated; and suppressing damage to the low-k film, the titanium-containing material, the tungsten-containing material and the copper or copper alloy and removing the dry etching residue on the surface of the product to be treated, in the process for manufacturing the semiconductor element that is the target of the present invention.

Comparative Example 44 (the Invention Described in Patent Document 21)

The semiconductor elements shown in FIGS. 3 and 4 were cleaned with a cleaning solution containing 1% by mass of butylamine, 4% by mass of hydroxylamine sulfate, 2.8% by mass of tetramethylammonium hydroxide, 2% by mass of citric acid, 5% by mass of dipropylene glycol and 85.2% by mass of water (Table 8, cleaning solution 2AM). Cleaning conditions and evaluation results are shown in Table 9. When using this cleaning solution, damage to the titanium-containing material and the tungsten-containing material was successfully suppressed, but it was impossible to remove the dry etching residue and the low-k film and the copper were damaged. Accordingly, it is understood that the cleaning solution 2AM cannot be used for the purposes of the present application of: suppressing damage to the low-k film and the titanium-containing material and removing the dry etching residue on the surface of the product to be treated; suppressing damage to the low-k film and the tungsten-containing material and removing the dry etching residue on the surface of the product to be treated; and suppressing damage to the low-k film, the titanium-containing material, the tungsten-containing material and the copper or copper alloy and removing the dry etching residue on the surface of the product to be treated, in the process for manufacturing the semiconductor element that is the target of the present invention.

Comparative Example 45

The semiconductor elements shown in FIGS. 5, 6, 7 and 8 were cleaned with a cleaning solution containing 6% by mass of hydrogen peroxide, 0.003% by mass of barium nitrate and 93.997% by mass of water (pH value: 5, Table 8, cleaning solution 2AN). Cleaning conditions and evaluation results are shown in Table 9. When using this cleaning solution, the dry etching residue was successfully removed and damage to the low-k film, the titanium-containing material, the tungsten-containing material and the copper was successfully suppressed, but it was impossible to remove the photoresist. Accordingly, it is understood that the cleaning solution 2AN cannot be used for the purposes of the present application of: suppressing damage to the low-k film and the titanium-containing material and removing the dry etching residue and the photoresist on the surface of the product to be treated; suppressing damage to the low-k film and the tungsten-containing material and removing the dry etching residue and the photoresist on the surface of the product to be treated; and suppressing damage to the low-k film, the titanium-containing material, the tungsten-containing material and the copper or copper alloy and removing the dry etching residue and the photoresist on the surface of the product to be treated, in the process for manufacturing the semiconductor element that is the target of the present invention.

Comparative Example 46 (the Invention Described in Patent Document 22)

The semiconductor elements shown in FIGS. 1, 2, 3 and 4 were cleaned with a cleaning solution containing 3.35% by mass of tetramethylammonium hydroxide, 0.11% by mass of trans-1,2-diaminocyclohexane-N,N,N',N'-tetraacetic acid monohydrate, 1.64% by mass of hydrogen peroxide, 0.23% by mass of hexafluorosilicic acid and 94.67% by mass of water (Table 8, cleaning solution 2AO). Cleaning conditions and evaluation results are shown in Table 9. When using this cleaning solution, damage to the titanium-containing material was successfully suppressed, but it was impossible to remove the dry etching residue and the low-k film, the tungsten-containing material and the copper were damaged. Accordingly, it is understood that the cleaning solution 2AO cannot be used for the purposes of the present application of: suppressing damage to the low-k film and the titanium-containing material and removing the dry etching residue on the surface of the product to be treated; suppressing damage to the low-k film and the tungsten-containing material and removing the dry etching residue on the surface of the product to be treated; and suppressing damage to the low-k film, the titanium-containing material, the tungsten-containing material and the copper or copper alloy and removing the dry etching residue on the surface of the product to be treated, in the process for manufacturing the semiconductor element that is the target of the present invention.

Comparative Example 47

The semiconductor elements shown in FIGS. 1, 2, 3 and 4 were cleaned with a cleaning solution containing 0.6% by mass of potassium hydroxide, 6% by mass of hydrogen peroxide, 0.5% by mass of hexafluorosilicic acid and 92.9% by mass of water (Table 8, cleaning solution 2AP). Cleaning conditions and evaluation results are shown in Table 9. When using this cleaning solution, the dry etching residue was successfully removed and damage to the copper was successfully suppressed, but the low-k film, the titanium-containing material and the tungsten-containing material were damaged. Accordingly, it is understood that the cleaning solution 2AP cannot be used for the purposes of the present application of: suppressing damage to the low-k film and the titanium-containing material and removing the dry etching residue on the surface of the product to be treated; suppressing damage to the low-k film and the tungsten-containing material and removing the dry etching residue on the surface of the product to be treated; and suppressing damage to the low-k film, the titanium-containing material, the tungsten-containing material and the copper or copper alloy and removing the dry etching residue on the surface of the product to be treated, in the process for manufacturing the semiconductor element that is the target of the present invention.

Comparative Example 48 (the Invention Described in Patent Document 23)

The semiconductor elements shown in FIGS. 1, 2, 3 and 4 were cleaned with a cleaning solution containing 2% by mass of tetramethylammonium hydroxide, 5% by mass of ammonium carbonate, 7.5% by mass of hydrogen peroxide, 0.5% by mass of a surfactant A $(H(OCH_2CH_2)_3—(OCH_2CH_2CH_2)_5—(OCH_2CH_2)_3H)$, 10% by mass of citric acid and 75% by mass of water (Table 8, cleaning solution 2AQ). Cleaning conditions and evaluation results are shown in Table 9. When using this cleaning solution, damage to the low-k film was successfully suppressed, but it was impossible to remove the dry etching residue and the titanium-containing material, the tungsten-containing material and the copper were damaged. Accordingly, it is understood that the cleaning solution 2AQ cannot be used for the purposes of the present application of: suppressing damage to the low-k film and the titanium-containing material and removing the dry etching residue on the surface of the product to be treated; suppressing damage to the low-k film and the tungsten-containing material and removing the dry etching residue on the surface of the product to be treated; and suppressing damage to the low-k film, the titanium-containing material, the tungsten-containing material and the copper or copper alloy and removing the dry etching residue on the surface of the product to be treated, in the process for manufacturing the semiconductor element that is the target of the present invention.

Comparative Example 49

The semiconductor elements shown in FIGS. 1, 2, 3 and 4 were cleaned with a cleaning solution containing 0.5% by mass of nitric acid, 6% by mass of hydrogen peroxide, 0.5% by mass of ammonium carbonate and 93% by mass of water (pH: 6.3, Table 8, cleaning solution 2AR). Cleaning conditions and evaluation results are shown in Table 9. When using this cleaning solution, the dry etching residue was successfully removed and damage to the low-k film and the copper was successfully suppressed, but the titanium-containing material and the tungsten-containing material were damaged. Accordingly, it is understood that the cleaning solution 2AR cannot be used for the purposes of the present application of: suppressing damage to the low-k film and the titanium-containing material and removing the dry etching residue on the surface of the product to be treated; suppressing damage to the low-k film and the tungsten-containing material and removing the dry etching residue on the surface of the product to be treated; and suppressing damage to the low-k film, the titanium-containing material, the tungsten-containing material and the copper or copper alloy and removing the dry etching residue on the surface of the product to be treated, in the process for manufacturing the semiconductor element that is the target of the present invention.

TABLE 1

| Cleaning solution | pH | Oxidant I Type | Concentration % by mass | Alkaline earth metal compound Type | Concentration % by mass | pH adjuster Type | Concentration % by mass | Water Concentration % by mass |
|---|---|---|---|---|---|---|---|---|
| 1A | 7.9 | Hydrogen peroxide | 30 | Barium nitrate | 0.1 | KOH | 1 | 68.9 |
| 1B | 13.1 | Hydrogen peroxide | 0.01 | Barium nitrate | 0.1 | KOH | 1 | 98.89 |
| 1C | 0.6 | Hydrogen peroxide | 6 | Barium nitrate | 1 | Nitric acid | 0.5 | 92.5 |
| 1D | 7.9 | Hydrogen peroxide | 30 | Barium nitrate | 0.2 | KOH | 1 | 68.8 |
| 1E | 9.8 | Hydrogen peroxide | 0.3 | Barium nitrate | 0.0005 | KOH | 0.01 | 99.6895 |
| 1F | 11.4 | Hydrogen peroxide | 6 | Barium nitrate | 0.003 | KOH | 4.5 | 89.497 |
| 1G | 9.9 | Hydrogen peroxide | 6 | Barium nitrate | 0.005 | KOH | 0.6 | 93.395 |
| 1H | 12.8 | Hydrogen peroxide | 0.5 | Barium nitrate | 0.5 | KOH | 1.2 | 97.8 |
| 1I | 11.0 | Hydrogen peroxide | 0.01 | Barium nitrate | 0.000005 | KOH | 0.01 | 99.979995 |
| 1J | 5.0 | Hydrogen peroxide | 6 | Barium nitrate | 0.1 | — | — | 93.9 |
| 1K | 2.0 | Hydrogen peroxide | 6 | Barium nitrate | 0.2 | Sulfuric acid | 0.05 | 93.75 |
| 1L | 1.5 | Hydrogen peroxide | 0.5 | Barium nitrate | 0.1 | Phosphoric acid | 1 | 98.4 |
| 1M | 7.7 | Hydrogen peroxide | 6 | Barium nitrate | 0.1 | Ammonia | 0.01 | 93.89 |
| 1N | 9.4 | Hydrogen peroxide | 6 | Barium nitrate | 0.005 | TMAH | 0.375 | 93.62 |
| 1O | 7.7 | Hydrogen peroxide | 6 | Barium nitrate | 0.3 | Triethylamine | 0.01 | 93.69 |
| 1P | 12.7 | mCPBA | 0.5 | Barium nitrate | 0.5 | KOH | 1.2 | 97.8 |
| 1Q | 12.8 | TBHP | 0.5 | Barium nitrate | 0.5 | KOH | 1.2 | 97.8 |
| 1R | 12.7 | Ammonium perchlorate | 0.5 | Barium nitrate | 0.5 | KOH | 1.2 | 97.8 |
| 1S | 9.9 | Hydrogen peroxide | 6 | Barium hydroxide | 0.0033 | KOH | 0.6 | 93.3967 |
| 1T | 9.9 | Hydrogen peroxide | 6 | Barium chloride | 0.004 | KOH | 0.6 | 93.396 |
| 1U | 9.7 | Hydrogen peroxide | 6 | Calcium nitrate | 0.02 | KOH | 0.6 | 93.38 |
| 1V | 9.8 | Hydrogen peroxide | 6 | Strontium chloride | 0.02 | KOH | 0.6 | 93.38 |
| 1W | 8.6 | Hydrogen peroxide | 30 | Barium nitrate | 0.04 | KOH | 3 | 66.96 |
| 1X | 9.9 | Hydrogen peroxide | 6 | Barium nitrate | 0.007 | KOH | 0.6 | 93.393 |
| 1Y | 9.9 | Hydrogen peroxide | 6 | Barium nitrate | 0.003 | KOH | 0.6 | 93.397 |
| 1Z | 9.3 | Hydrogen peroxide | 6 | Barium nitrate | 0.007 | $K_2CO_3$ | 0.74 | 93.253 |
| 1AA | 10.8 | Hydrogen peroxide | 6 | Barium nitrate | 0.003 | LiOH | 3 | 90.997 |
| 1AB | 11.7 | Hydrogen peroxide | 6 | Barium nitrate | 0.003 | NaOH | 4.5 | 89.497 |

TABLE 1-continued

| Cleaning solution | pH | Oxidant I Type | Concentration % by mass | Alkaline earth metal compound Type | Concentration % by mass | pH adjuster Type | Concentration % by mass | Water Concentration % by mass |
|---|---|---|---|---|---|---|---|---|
| 1AC | 9.9 | Hydrogen peroxide | 6 | Barium nitrate | 0.007 | CsOH | 1.60 | 92.393 |
| 1AD | 9.9 | Hydrogen peroxide | 6 | Calcium nitrate | 0.01 | KOH | 0.6 | 93.39 |
| 1AE | 9.9 | Hydrogen peroxide | 6 | Strontium chloride | 0.01 | KOH | 0.6 | 93.39 |
| 1AF | 9.9 | Hydrogen peroxide | 6 | Barium hydroxide | 0.01 | KOH | 0.6 | 93.39 |
| 1AG | 9.9 | Hydrogen peroxide | 6 | Barium chloride | 0.0024 | KOH | 4.5 | 89.4976 |
| 1AH | 9.8 | Hydrogen peroxide | 1 | Barium nitrate | 1 | Ammonia | 0.1 | 97.9 |
| 1AI | 10.7 | Hydrogen peroxide | 1 | Barium nitrate | 1 | TMAH | 1 | 97 |
| 1AJ | 5.0 | Hydrogen peroxide | 6 | Barium nitrate | 0.003 | — | — | 93.997 |

Oxidant I: peroxide or perchloric acid or perchlorate salt
KOH: potassium hydroxide
TMAH: tetramethylammonium hydroxide
mCPBA: m-chloroperoxybenzoic acid
TBHP: tert-butyl hydroperoxide
$K_2CO_3$: potassium carbonate
LiOH: lithium hydroxide
NaOH: sodium hydroxide
CsOH: cesium hydroxide

TABLE 2

| Examples | Cleaning solution | Temperature ° C. | Immersion time min | Removal state I | Damage II | Damage III |
|---|---|---|---|---|---|---|
| 1 | 1A | 60 | 20 | E | E | E |
| 2 | 1B | 60 | 6 | E | E | E |
| 3 | 1C | 60 | 10 | E | E | E |
| 4 | 1D | 60 | 20 | E | E | E |
| 5 | 1E | 70 | 10 | E | E | E |
| 6 | 1F | 20 | 15 | E | E | E |
| 7 | 1G | 40 | 60 | E | E | E |
| 8 | 1H | 70 | 0.5 | G | G | E |
| 9 | 1I | 70 | 10 | E | E | E |
| 10 | 1J | 60 | 30 | E | E | E |
| 11 | 1K | 60 | 10 | E | E | E |
| 12 | 1L | 60 | 30 | E | E | E |
| 13 | 1M | 60 | 30 | E | E | E |
| 14 | 1N | 40 | 60 | E | E | E |
| 15 | 1O | 70 | 10 | E | E | E |
| 16 | 1P | 70 | 20 | E | E | E |
| 17 | 1Q | 70 | 20 | E | E | E |
| 18 | 1R | 70 | 20 | E | E | E |
| 19 | 1S | 40 | 60 | E | E | E |
| 20 | 1T | 40 | 60 | E | E | E |
| 21 | 1U | 40 | 60 | G | E | E |
| 22 | 1V | 40 | 60 | E | E | E |

Removal state I: removal state of dry etching residue 3
Damage II: damage to titanium-containing material 1
Damage III: damage to low-k film 2

TABLE 3

| Examples | Cleaning solution | Temperature ° C. | Immersion time min | Removal state I | Damage III | Damage IV |
|---|---|---|---|---|---|---|
| 23 | 1A | 60 | 20 | E | E | E |
| 24 | 1B | 60 | 6 | E | E | E |
| 25 | 1D | 60 | 20 | E | E | E |
| 26 | 1E | 70 | 10 | E | E | E |
| 27 | 1F | 20 | 15 | E | E | E |

TABLE 3-continued

| Examples | Cleaning solution | Temperature ° C. | Immersion time min | Removal state I | Damage III | Damage IV |
|---|---|---|---|---|---|---|
| 28 | 1G | 40 | 60 | E | E | E |
| 29 | 1H | 70 | 0.5 | G | E | E |
| 30 | 1I | 70 | 10 | E | E | E |
| 31 | 1J | 60 | 30 | E | E | E |
| 32 | 1M | 60 | 30 | E | E | E |
| 33 | 1N | 40 | 60 | E | E | E |
| 34 | 1O | 70 | 10 | E | E | E |
| 35 | 1P | 70 | 20 | E | E | E |
| 36 | 1Q | 70 | 20 | E | E | E |
| 37 | 1R | 70 | 20 | E | E | E |
| 38 | 1S | 40 | 60 | E | E | E |
| 39 | 1T | 40 | 60 | E | E | E |
| 40 | 1U | 40 | 60 | G | E | G |
| 41 | 1V | 40 | 60 | E | E | G |

Removal state I: removal state of dry etching residue 3
Damage II: damage to low-k film 2
Damage IV: damage to tungsten-containing material 4

TABLE 4

| Examples | Cleaning solution | Temperature ° C. | Immersion time min | Removal state I | Damage II | Damage III | Damage IV | Damage V |
|---|---|---|---|---|---|---|---|---|
| 42 | 1A | 60 | 20 | E | E | E | E | G |
| 43 | 1F | 20 | 5 | E | E | E | E | E |
| 44 | 1H | 70 | 0.5 | G | E | E | E | E |
| 45 | 1I | 70 | 10 | E | E | E | E | E |
| 46 | 1W | 60 | 6 | E | E | E | E | G |
| 47 | 1X | 60 | 6 | G | E | E | E | E |
| 48 | 1Y | 40 | 60 | G | E | E | E | E |
| 49 | 1Z | 60 | 6 | G | E | E | E | E |
| 50 | 1AA | 20 | 5 | G | E | E | E | E |
| 51 | 1AB | 20 | 5 | G | E | E | E | E |
| 52 | 1AC | 60 | 6 | G | E | E | G | E |
| 53 | 1AD | 60 | 6 | G | E | E | E | E |
| 54 | 1AE | 60 | 6 | G | E | E | E | E |
| 55 | 1AF | 60 | 6 | G | E | E | G | E |
| 56 | 1AG | 20 | 5 | G | E | E | E | E |
| 57 | 1AH | 60 | 10 | E | E | E | E | E |
| 58 | 1AI | 60 | 8 | G | E | E | E | E |
| 59 | 1AJ | 60 | 30 | E | E | E | E | E |

Removal state I: removal state of dry etching residue 3
Damage II: damage to titanium-containing material 1
Damage III: damage to low-k film 2
Damage IV: damage to tungsten-containing material 4
Damage V: damage to copper 5

TABLE 5

| Examples | Cleaning solution | Temperature ° C. | Immersion time min | Removal state I | Removal state VI | Damage II | Damage III | Damage IV |
|---|---|---|---|---|---|---|---|---|
| 60 | 1P | 70 | 20 | E | E | E | E | E |
| 61 | 1Q | 70 | 20 | E | E | E | E | E |
| 62 | 1R | 70 | 20 | E | E | E | E | E |

Removal state I: removal state of dry etching residue 3
Removal state VI: removal state of photoresist 8
Damage II: damage to titanium-containing material 1
Damage III: damage to low-k film 2
Damage IV: damage to tungsten-containing material 4

TABLE 6

| Examples | Cleaning solution | Temperature °C. | Immersion time min | Removal state I | Removal state VI | Damage II | III | IV | V |
|---|---|---|---|---|---|---|---|---|---|
| 63 | 1A | 60 | 20 | E | E | E | E | E | G |
| 64 | 1F | 20 | 5 | E | E | E | E | E | E |
| 65 | 1H | 70 | 0.5 | G | E | E | E | E | E |
| 66 | 1I | 70 | 10 | E | E | E | E | E | E |
| 67 | 1W | 60 | 6 | E | E | E | E | E | G |
| 68 | 1X | 60 | 6 | G | E | E | E | E | E |
| 69 | 1Y | 40 | 60 | G | E | E | E | E | E |
| 70 | 1Z | 60 | 6 | G | E | E | E | E | E |
| 71 | 1AA | 20 | 5 | G | E | E | E | E | E |
| 72 | 1AB | 20 | 5 | G | E | E | E | E | E |
| 73 | 1AC | 60 | 6 | G | E | E | E | G | E |
| 74 | 1AD | 60 | 6 | G | E | E | E | E | E |
| 75 | 1AE | 60 | 6 | G | E | E | E | E | E |
| 76 | 1AF | 60 | 6 | G | E | E | E | G | E |
| 77 | 1AG | 20 | 5 | G | E | E | E | E | E |
| 78 | 1AH | 60 | 10 | E | E | E | E | E | E |
| 79 | 1AI | 60 | 8 | G | E | E | E | E | E |

Removal state I: removal state of dry etching residue 3
Damage II: damage to titanium-containing material 1
Damage III: damage to low-k film 2
Damage IV: damage to tungsten-containing material 4
Damage V: damage to copper 5
Removal state VI: removal state of photoresist 8

TABLE 7

| Cleaning solution | pH | Oxidant I Type | Oxidant I Concentration % by mass | Alkaline earth metal compound Type | Alkaline earth metal compound Concentration % by mass | pH adjuster Type | pH adjuster Concentration % by mass | Water Concentration % by mass |
|---|---|---|---|---|---|---|---|---|
| 2A | 7.9 | Hydrogen peroxide | 30 | — | — | KOH | 1 | 69 |
| 2B | 13.1 | Hydrogen peroxide | 0.01 | — | — | KOH | 1 | 98.99 |
| 2C | 0.6 | Hydrogen peroxide | 6 | — | — | Nitric acid | 0.5 | 93.5 |
| 2D | 7.9 | Hydrogen peroxide | 30 | — | — | KOH | 1 | 69 |
| 2E | 9.8 | Hydrogen peroxide | 0.3 | — | — | KOH | 0.01 | 99.69 |
| 2F | 11.4 | Hydrogen peroxide | 6 | — | — | KOH | 4.5 | 89.5 |
| 2G | 9.9 | Hydrogen peroxide | 6 | — | — | KOH | 0.6 | 93.4 |
| 2H | 12.8 | Hydrogen peroxide | 0.5 | — | — | KOH | 1.2 | 98.3 |
| 2I | 11.0 | Hydrogen peroxide | 0.01 | — | — | KOH | 0.01 | 99.98 |
| 2J | 5 | Hydrogen peroxide | 6 | — | — | — | — | 94 |
| 2K | 2 | Hydrogen peroxide | 6 | — | — | Sulfuric acid | 0.05 | 93.95 |
| 2L | 1.5 | Hydrogen peroxide | 0.5 | — | — | Phosphoric acid | 1 | 98.5 |
| 2M | 7.7 | Hydrogen peroxide | 6 | — | — | Ammonia | 0.01 | 93.99 |
| 2N | 9.4 | Hydrogen peroxide | 6 | — | — | TMAH | 0.375 | 93.625 |
| 2O | 7.7 | Hydrogen peroxide | 6 | — | — | Triethylamine | 0.01 | 93.99 |
| 2P | 12.7 | mCPBA | 0.5 | — | — | KOH | 1.2 | 98.3 |
| 2Q | 12.8 | TBHP | 0.5 | — | — | KOH | 1.2 | 98.3 |
| 2R | 12.7 | Ammonium perchlorate | 0.5 | — | — | KOH | 1.2 | 98.3 |

Oxidant I: peroxide or perchloric acid or perchlorate salt
KOH: potassium hydroxide
TMAH: tetramethylammonium hydroxide
mCPBA: m-chloroperoxybenzoic acid
TBHP: tert-butyl hydroperoxide

TABLE 8

| Cleaning solution | Composition of cleaning solution (concentration: % by mass) |
|---|---|
| 2S | TMAH: 12%, hydrogen peroxide: 5%, KOH: 2%, triethanolamine: 35%, water: 46% |
| 2T | NaOH: 3%, hydrogen peroxide: 2%, polypropylene glycol (number-average molecular weight: 400): 0.05%, water: 94.95% |
| 2U | hydroxylamine sulfate: 4%, TMAH: 3.8%, citric acid: 1%, 2-methylimidazole: 1%, water: 90.2% |
| 2V | hydroxylamine sulfate: 4%, TMAH: 4.7%, acetic acid: 1%, hydroxylethylmorpholine: 2%, water: 88.3% |
| 2W | hydroxylamine: 15%, monoethanolamine: 10%, DMSO: 55%, catechol: 5%, water: 15% |
| 2X | phosphoric acid: 1.35%, hydrochloric acid: 1%, TMAH: 5%, sodium lauryl diaminoethyl glycinate: 0.01%, water: 92.64% |
| 2Y | hydrogen peroxide: 5%, aminotriazole: 0.01%, water: 94.99% |
| 2Z | hydrogen peroxide: 15%, benzyltrimethylammonium hydroxide: 0.2%, Ethoquad O/12: 0.001%, water: 84.799% |
| 2AA | TEAH: 10%, NaOH: 0.02%, 2-ethyl-4-methylimidazole: 2%, DMSO: 40%, water: 47.98% |
| 2AB | hydrogen peroxide: 14%, hydrofluoric acid: 0.3%, DGME: 58.4%, vinylimidazole: 1%, water: 26.3% |
| 2AC | hydrofluoric acid: 0.3%, DGME: 60%, 2-ethyl-4-methylimidazole: 1%, water: 38.7% |
| 2AD | hydrofluoric acid: 0.1%, aminopropyltrimethoxysilane: 0.1%, benzotriazole: 0.1%, ethanol: 1%, acetic acid: 1%, water: 97.7% |
| 2AE | hydroxylamine sulfate: 2%, TMAH: 3.4%, citric acid: 2%, sorbitol: 0.5%, water: 92.1% |
| 2AF | ammonium acetate: 5%, glycine: 0.8%, ammonia: 0.18%, DMSO: 3.6%, water: 90.42% |
| 2AG | KOH: 4.5%, barium nitrate: 0.003%, water: 95.497% |
| 2AH | N,N-diethylhydroxylamine: 10%, hydroxylamine: 15%, DMSO: 50%, catechol: 10%, water: 15% |
| 2AI | monoethanolamine: 10%, N,N-diethylhydroxylamine: 10%, DGBE: 30%, sorbitol: 10%, water: 40% |
| 2AJ | KOH: 0.005%, TMAH: 10%, DGME: 50%, pyrazole: 0.1%, water: 39.895% |
| 2AK | benzotriazole: 0.1%, 1,2,4-triazole: 0.1%, ammonium fluoride: 5%, boric acid: 1%, water: 93.8% |
| 2AL | ammonium fluoride: 0.25%, gluconic acid: 0.06%, water: 99.69% |
| 2AM | butylamine: 1%, hydroxylamine sulfate: 4%, TMAH: 2.8%, citric acid: 2%, dipropylene glycol: 5%, water: 85.2% |
| 2AN | hydrogen peroxide: 6%, barium nitrate: 0.003%, water: 93.997% |
| 2AO | TMAH: 3.35%, CyDTA: 0.11%, hydrogen peroxide: 1.64%, hexafluorosilicic acid: 0.23%, water: 94.67% |
| 2AP | KOH: 0.6%, hydrogen peroxide: 6%, hexafluorosilicic acid: 0.5%, water: 92.9% |
| 2AQ | TMAH: 2%, ammonium carbonate: 5%, hydrogen peroxide: 7.5%, surfactant A: 0.5%, citric acid: 10%, water: 75% |
| 2AR | nitric acid: 0.5%, hydrogen peroxide: 6%, ammonium carbonate: 0.5%, water: 93% |

TMAH: tetramethylammonium hydroxide
KOH: potassium hydroxide
NaOH: sodium hydroxide
DMSO: dimethyl sulfoxide
Ethoquad O/12: [oleylbis(2-hydroxyethyl)methylammonium-bis(trifluoromethanesulfonyl)imide] (manufactured by Lion Corporation)
TEAH: tetraethylammonium hydroxide
DGME: diethylene glycol monomethyl ether
DGBE: diethylene glycol monobutyl ether
CyDTA: trans-1,2-diaminocyclohexane-N,N,N',N'-tetraacetic acid monohydrate
Surfactant A: substance having the below-described chemical structure: $H(OCH_2CH_2)_3$—$(OCH_2CH_2CH_2)_5$—$(OCH_2CH_2)_3H$

TABLE 9

| Comparative Examples | Cleaning solution | Temperature °C. | Immersion time min | Removal state I | Removal state VI | Damage II | III | IV | V |
|---|---|---|---|---|---|---|---|---|---|
| 1 | 2A | 60 | 20 | E | — | P | E | P | — |
| 2 | 2B | 60 | 6 | E | — | P | E | P | — |
| 3 | 2C | 60 | 10 | E | — | P | E | — | — |
| 4 | 2D | 60 | 20 | E | — | P | E | P | — |
| 5 | 2E | 70 | 10 | E | — | P | E | P | — |
| 6 | 2F | 20 | 15 | E | — | P | E | P | — |
| 7 | 2G | 40 | 60 | E | — | P | E | P | — |
| 8 | 2H | 70 | 0.5 | G | — | P | E | P | — |
| 9 | 2I | 70 | 10 | E | — | P | E | P | — |
| 10 | 2J | 60 | 30 | E | — | P | E | P | — |
| 11 | 2K | 60 | 10 | E | — | P | E | — | — |
| 12 | 2L | 60 | 30 | E | — | P | E | — | — |
| 13 | 2M | 60 | 30 | E | — | P | E | P | — |
| 14 | 2N | 40 | 60 | E | — | P | E | P | — |
| 15 | 2O | 70 | 10 | E | — | P | E | P | — |

TABLE 9-continued

| Comparative Examples | Cleaning solution | Temperature ° C. | Immersion time min | Removal state I | Removal state VI | Damage II | III | IV | V |
|---|---|---|---|---|---|---|---|---|---|
| 16 | 2P | 70 | 20 | E | — | P | E | P | — |
| 17 | 2Q | 70 | 20 | E | — | P | E | P | — |
| 18 | 2R | 70 | 20 | E | — | P | E | P | — |
| 19 | 2S | 50 | 40 | E | — | P | E | — | — |
| 20 |   | 50 | 20 | P | — | P | E | — | — |
| 21 | 2T | 50 | 40 | E | — | P | E | — | — |
| 22 |   | 50 | 20 | P | — | P | E | — | — |
| 23 | 2U | 70 | 30 | P | — | E | P | — | — |
| 24 | 2V | 70 | 10 | P | — | E | P | — | — |
| 25 | 2W | 65 | 20 | P | — | E | P | — | — |
| 26 | 2X | 60 | 6 | P | — | — | P | E | — |
| 27 | 2Y | 25 | 30 | E | — | — | E | P | — |
| 28 |   | 25 | 5 | P | — | — | E | P | — |
| 29 | 2Z | 40 | 10 | P | — | — | E | P | — |
| 30 |   | 40 | 30 | E | — | — | E | P | — |
| 31 | 2AA | 50 | 40 | P | — | — | P | E | — |
| 32 | 2AB | 60 | 10 | P | — | — | P | P | — |
| 33 |   | 60 | 30 | E | — | — | P | P | — |
| 34 | 2AC | 60 | 10 | P | — | — | P | E | — |
| 35 | 2AD | 60 | 10 | P | — | — | P | E | — |
| 36 | 2AE | 50 | 10 | P | — | — | E | P | — |
| 37 | 2AF | 70 | 30 | P | — | — | P | E | — |
| 38 | 2AG | 20 | 5 | P | — | E | P | E | E |
| 39 | 2AH | 70 | 10 | P | — | P | P | E | P |
| 40 | 2AI | 40 | 5 | P | — | E | P | E | E |
| 41 | 2AJ | 50 | 20 | P | — | E | P | G | E |
| 42 | 2AK | 50 | 6 | P | — | E | P | E | G |
| 43 | 2AL | 25 | 1 | P | — | E | P | E | E |
| 44 | 2AM | 70 | 15 | P | — | E | P | E | P |
| 45 | 2AN | 20 | 5 | G | P | E | E | E | G |
| 46 | 2AO | 40 | 0.5 | P | — | G | P | P | P |
| 47 | 2AP | 40 | 60 | E | — | P | P | P | E |
| 48 | 2AQ | 50 | 3 | P | — | P | E | P | P |
| 49 | 2AR | 60 | 10 | E | — | P | E | P | E |

Removal state I: removal state of dry etching residue 3
Damage II: damage to titanium-containing material 1
Damage III: damage to low-k film 2
Damage IV: damage to tungsten-containing material 4
Damage V: damage to copper 5
Removal state VI: removal state of photoresist 8
pH of 2AN: 5
pH of 2AR: 6.3
—: not carried out

INDUSTRIAL APPLICABILITY

When using the cleaning solution and the cleaning method of the present invention, in the process for manufacturing the semiconductor element, damage to at least the low-k film and at least one material selected from the titanium-containing material and the tungsten-containing material can be suppressed, the photoresist and the dry etching residue on the surface of the product to be treated can be removed, the semiconductor element having high precision and high quality can be produced with a high yield, and therefore these are industrially useful.

EXPLANATIONS OF LETTERS OR NUMERALS

1: titanium-containing material
2: interlayer dielectric film (low-k film)
3: dry etching residue
4: tungsten-containing material
5: copper
6: barrier metal
7: barrier insulating film
8: photoresist

The invention claimed is:

1. A cleaning solution which removes a dry etching residue and a photoresist on a surface of a semiconductor element having a low dielectric constant film (a low-k film) and at least one material selected from a material that contains 10 atomic % or more of titanium and a material that contains 10 atomic % or more of tungsten, wherein:
   the cleaning solution comprises:
      0.002 to 50% by mass of at least one oxidant selected from the group consisting of a peroxide, perchloric acid and a perchlorate salt,
      0.000001 to 5% by mass of an alkaline earth metal compound,
      a pH adjuster, and
      water;
   the cleaning solution has a pH value ranging from 3 to 14; and
   the cleaning solution does not contain hydrogen fluoride and does not contain strontium nitrate.

2. The cleaning solution according to claim 1, wherein the pH value of the cleaning solution is 7.7 to 14.

3. The cleaning solution according to claim 1, wherein the cleaning solution includes at least one peroxide selected from the group consisting of hydrogen peroxide, urea peroxide, m-chloro peroxybenzoic acid, tert-butyl hydroperoxide, peracetic acid, di-tert-butyl peroxide, benzoyl peroxide, acetone peroxide, methyl ethyl ketone peroxide, hexamethylene triperoxide and cumene hydroperoxide.

4. The cleaning solution according to claim 1, wherein the cleaning solution comprises at least one perchlorate salt selected from the group consisting of ammonium perchlorate, potassium perchlorate, calcium perchlorate, magnesium perchlorate, silver perchlorate, sodium perchlorate, barium perchlorate, lithium perchlorate, zinc perchlorate, acetylcholine perchlorate, lead perchlorate, rubidium perchlorate, cesium perchlorate, cadmium perchlorate, iron perchlorate, aluminium perchlorate, strontium perchlorate, tetrabutylammonium perchlorate, lanthanum perchlorate, indium perchlorate and tetra-n-hexylammonium perchlorate.

5. The cleaning solution according to claim 1, wherein the oxidant is hydrogen peroxide.

6. The cleaning solution according to claim 1, wherein the pH value of the cleaning solution ranges from 8 to 14.

7. The cleaning solution according to claim 1, wherein:
the cleaning solution is adapted to function as a cleaning solution that removes a dry etching residue and a photoresist on a surface of a semiconductor element having a low dielectric constant film (a low-k film) and at least one material selected from the group consisting of a material comprising 10 atomic % or more of titanium and a material comprising 10 atomic % or more of tungsten; and
the at least one material comprises at least one selected from the group consisting of titanium oxide, titanium nitride, titanium and titanium silicide.

8. The cleaning solution according to claim 1, wherein:
the cleaning solution is adapted to function as a cleaning solution that removes a dry etching residue and a photoresist on a surface of a semiconductor element having a low dielectric constant film (a low-k film) and at least one material selected from the group consisting of a material comprising 10 atomic % or more of titanium and a material comprising 10 atomic % or more of tungsten; and
the at least one material comprises at least one selected from the group consisting of tungsten oxide, tungsten nitride, tungsten and tungsten silicide.

9. The cleaning solution according to claim 1, wherein the alkaline earth metal compound is at least one selected from the group consisting of a calcium compound, a strontium compound and a barium compound, with the proviso that the strontium compound does not include the strontium nitrate.

10. A cleaning method for removing a dry etching residue and a photoresist on a surface of a semiconductor element having a low dielectric constant film (a low-k film) and at least one material selected from the group consisting of a material comprising 10 atomic % or more of titanium and a material comprising 10 atomic % or more of tungsten, said method comprising contacting the surface with the cleaning solution of claim 1.

11. The cleaning solution according to claim 1, wherein the alkaline earth metal compound is selected from the group consisting of an alkaline earth metal acetate, an alkaline earth metal bromide, an alkaline earth metal chloride, an alkaline earth metal fluoride, an alkaline earth metal iodide, an alkaline earth metal nitrate, an alkaline earth metal oxide, an alkaline earth metal phosphate, an alkaline earth metal sulfate, and combinations thereof.

* * * * *